(12) United States Patent
Ikehashi

(10) Patent No.: US 9,921,238 B2
(45) Date of Patent: Mar. 20, 2018

(54) SENSOR AND ITS MANUFACTURING METHOD

(71) Applicant: KABUSHIKI KAISHA TOSHIBA, Minato-ku, Tokyo (JP)

(72) Inventor: Tamio Ikehashi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 181 days.

(21) Appl. No.: 14/836,558

(22) Filed: Aug. 26, 2015

(65) Prior Publication Data

US 2016/0187370 A1 Jun. 30, 2016

(30) Foreign Application Priority Data

Dec. 26, 2014 (JP) ................. 2014-264677

(51) Int. Cl.
*G01P 15/125* (2006.01)
*B81B 3/00* (2006.01)
*B81C 1/00* (2006.01)
*G01P 15/18* (2013.01)
*G01P 15/08* (2006.01)

(52) U.S. Cl.
CPC .......... *G01P 15/125* (2013.01); *B81B 3/0086* (2013.01); *B81C 1/00166* (2013.01); *G01P 15/18* (2013.01); *B81B 2201/0235* (2013.01); *B81B 2201/0264* (2013.01); *B81B 2203/0136* (2013.01); *G01P 2015/084* (2013.01); *G01P 2015/0865* (2013.01)

(58) Field of Classification Search
CPC .. G01P 15/125; G01P 15/18; G01P 2015/084; G01P 2015/0865; B81B 3/0086; B81B 2201/0235; B81B 2201/0264; B81B 2203/0136; B81B 2201/881; B81C 1/00166

See application file for complete search history.

(56) References Cited

U.S. PATENT DOCUMENTS 5,417,312 A * 5/1995 Tsuchitani ............ G01P 1/003
188/181 A
6,240,782 B1 * 6/2001 Kato ................... G01P 15/0802
361/280
6,263,735 B1 * 7/2001 Nakatani ............ G01P 15/0802
73/514.32

(Continued)

FOREIGN PATENT DOCUMENTS

CN 101184978 A 5/2008
CN 103373698 A 10/2013

(Continued)

*Primary Examiner* — Lisa Caputo
*Assistant Examiner* — Philip Cotey
(74) *Attorney, Agent, or Firm* — Holtz Holtz & Volek PC

(57) ABSTRACT

According to one embodiment, a sensor is disclosed. The sensor includes a substrate, a first fixed electrode arranged on the substrate, a movable electrode arranged above the first fixed electrode and being movable non-parallelly, a second fixed electrode arranged above the movable electrode. The sensor further includes a detector to detect a difference between a first capacitance between the first fixed electrode and the movable electrode and a second capacitance between the movable electrode and the second fixed electrode.

18 Claims, 27 Drawing Sheets

(56) References Cited

U.S. PATENT DOCUMENTS

| | | | |
|---|---|---|---|
| 7,442,570 B2 | 10/2008 | Nasiri et al. | |
| 7,866,210 B2* | 1/2011 | Fujii | B81B 7/0006 |
| | | | 73/514.29 |
| 8,176,782 B2* | 5/2012 | Furukubo | G01P 1/023 |
| | | | 73/514.32 |
| 2005/0012165 A1 | 1/2005 | Otani | |
| 2007/0273393 A1* | 11/2007 | Furukubo | G01P 15/0802 |
| | | | 324/661 |
| 2008/0196502 A1 | 8/2008 | Fukuda et al. | |
| 2009/0199637 A1* | 8/2009 | Sugiura | G01P 15/0802 |
| | | | 73/514.32 |
| 2010/0059836 A1 | 3/2010 | Miyoshi et al. | |
| 2010/0107763 A1 | 5/2010 | Lin et al. | |
| 2010/0288047 A1* | 11/2010 | Takagi | B81C 1/00246 |
| | | | 73/514.32 |
| 2013/0049525 A1 | 2/2013 | Petkov et al. | |
| 2013/0120327 A1 | 5/2013 | Seo et al. | |
| 2013/0125649 A1* | 5/2013 | Simoni | G01P 15/18 |
| | | | 73/504.04 |
| 2013/0220016 A1* | 8/2013 | Simoni | B81C 1/00198 |
| | | | 73/514.32 |
| 2013/0234263 A1 | 9/2013 | Ikehashi | |
| 2013/0285168 A1 | 10/2013 | Wang et al. | |
| 2013/0346015 A1* | 12/2013 | Yamanaka | G01C 19/5747 |
| | | | 702/141 |
| 2014/0203403 A1* | 7/2014 | Shimanouchi | H02N 1/006 |
| | | | 257/532 |
| 2015/0132959 A1* | 5/2015 | Tedeschi | H01L 21/02274 |
| | | | 438/694 |
| 2015/0212187 A1 | 7/2015 | Kakinuma et al. | |

FOREIGN PATENT DOCUMENTS

| | | |
|---|---|---|
| CN | 103792267 A | 5/2014 |
| CN | 103792268 A | 5/2014 |
| CN | 103858014 A | 6/2014 |
| CN | 104113810 A | 10/2014 |
| JP | 10148643 | 6/1998 |
| JP | 2008008820 A | 1/2008 |
| JP | 2010078425 A | 4/2010 |
| JP | 2012507716 A | 3/2012 |
| JP | 2013103285 A | 5/2013 |
| TW | 200504367 A | 2/2005 |
| TW | 201012739 A | 4/2010 |
| TW | 201118032 A | 6/2011 |
| TW | 201337326 A | 9/2013 |
| WO | 2006130425 A8 | 4/2007 |
| WO | 2014163076 A1 | 10/2014 |

* cited by examiner

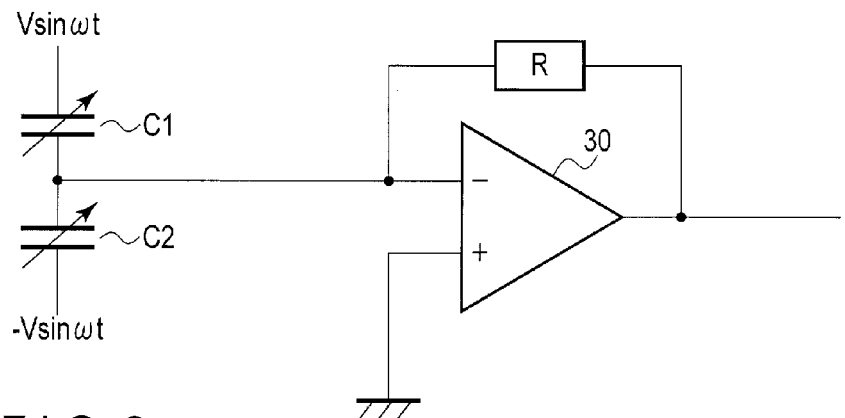
F I G. 2
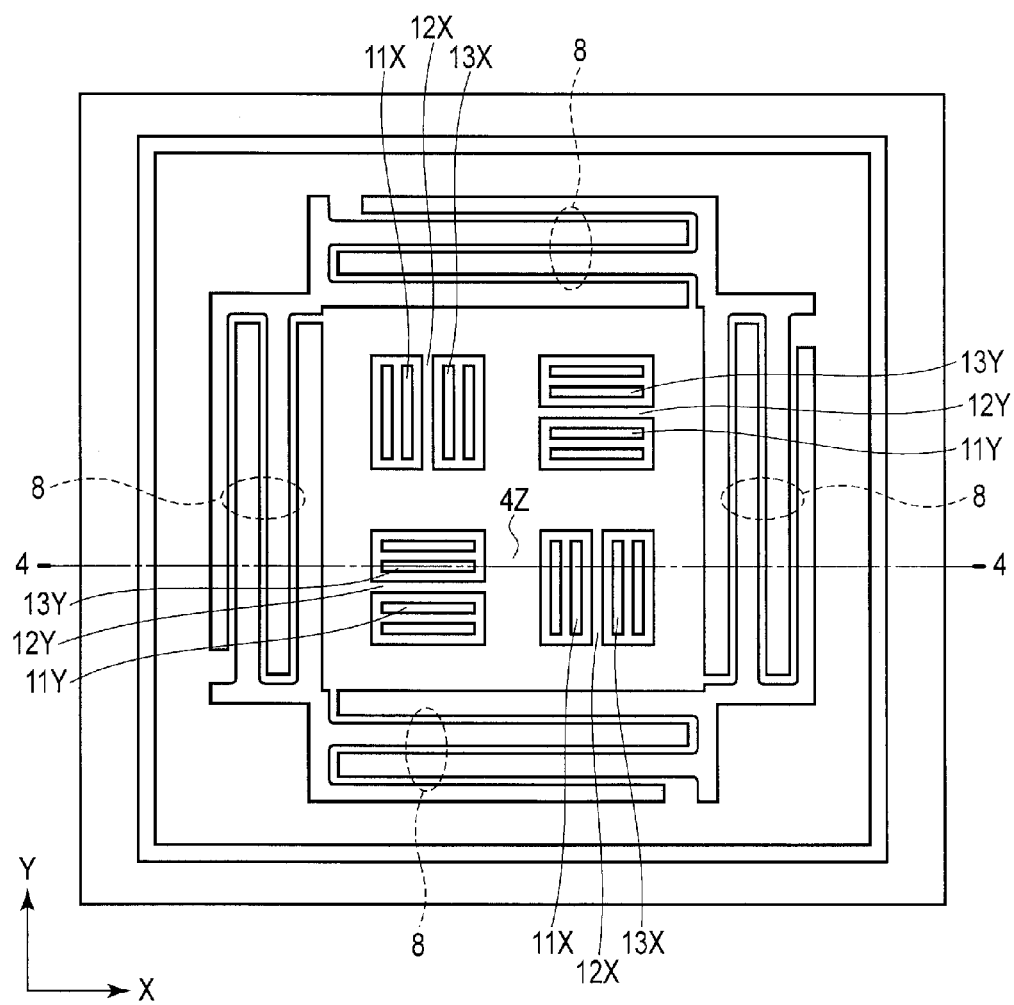
F I G. 3

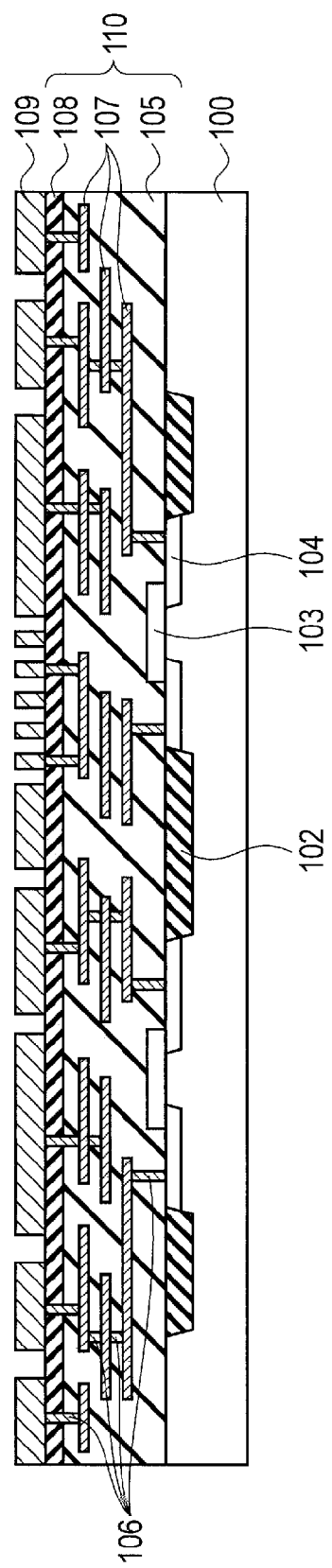
F I G. 5

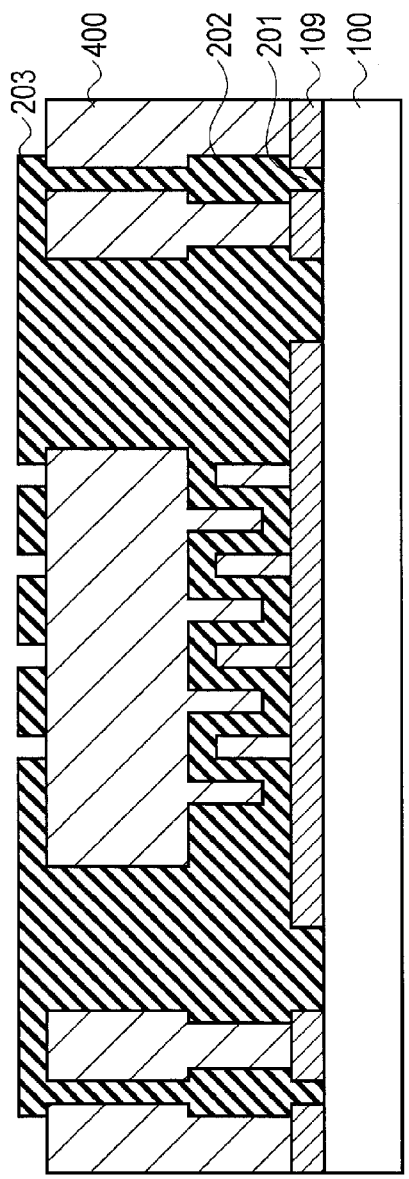
F I G. 31
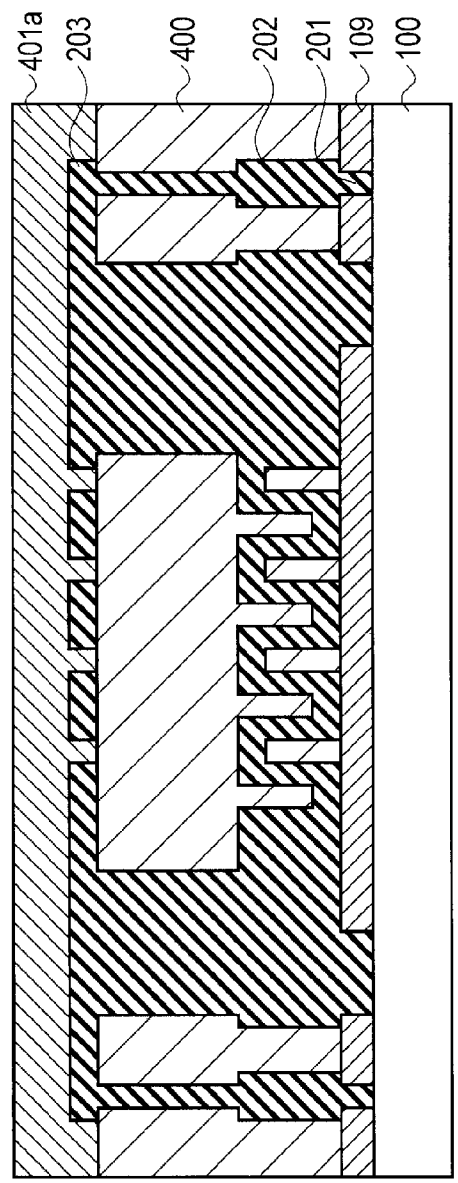
F I G. 32

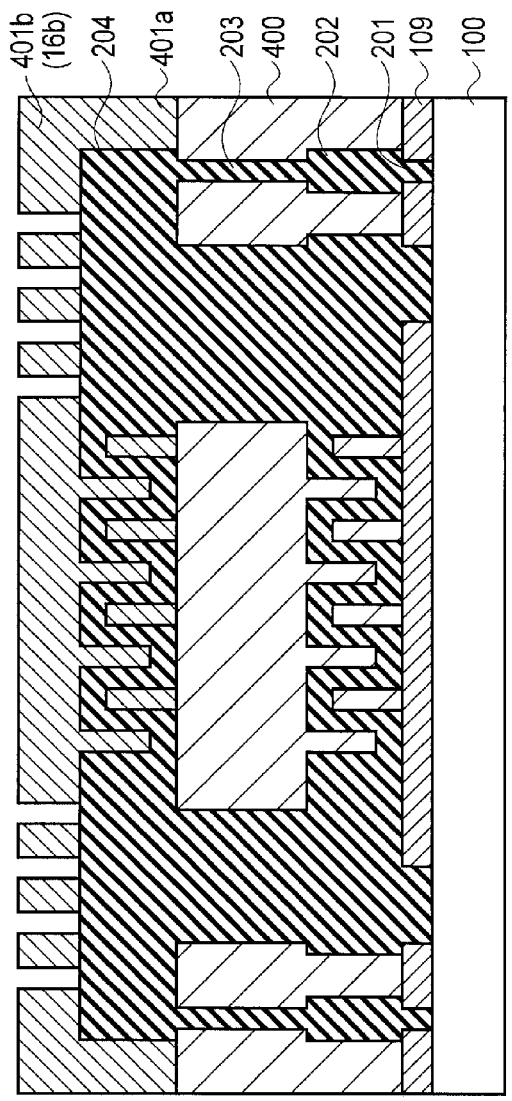
F I G. 35
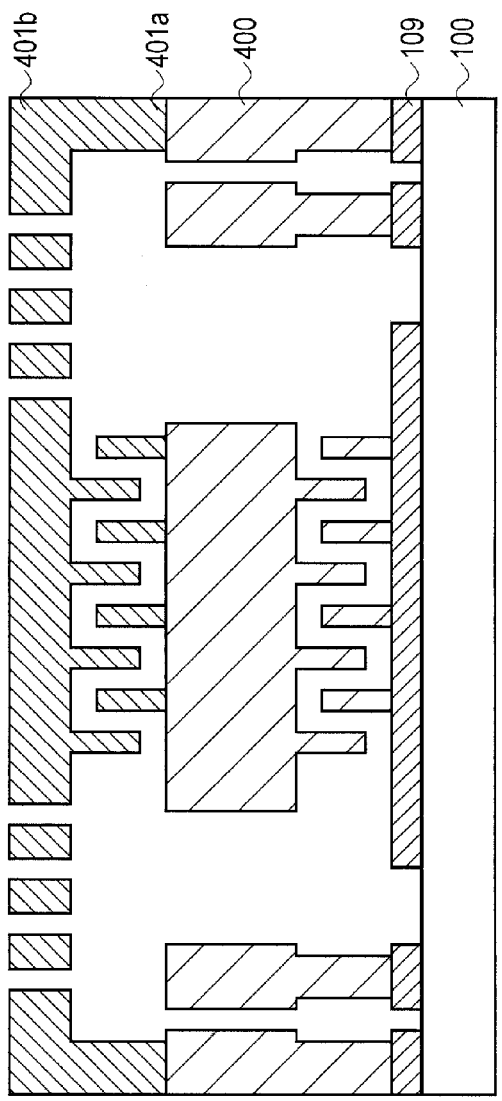
F I G. 36

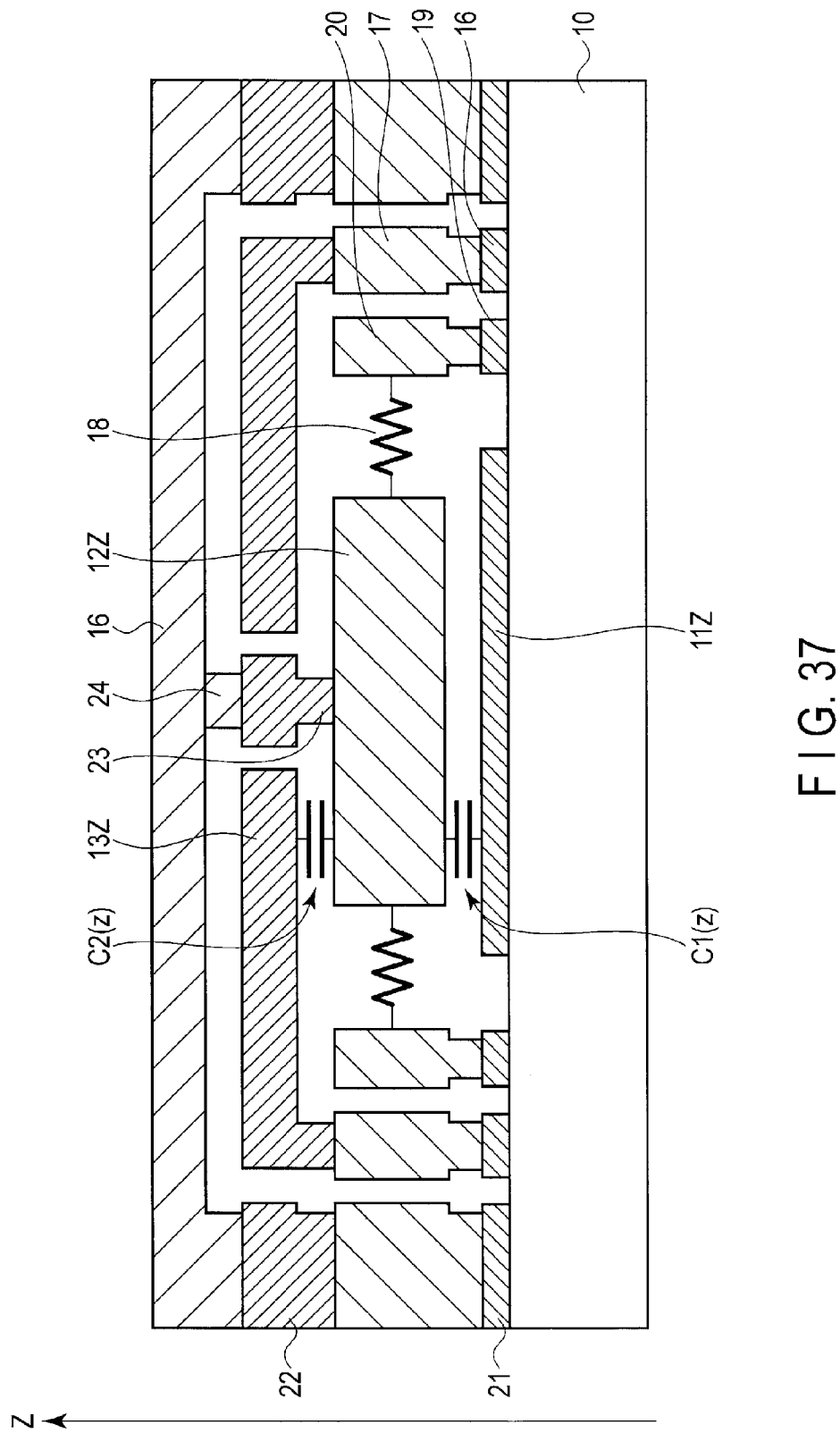
F I G. 37

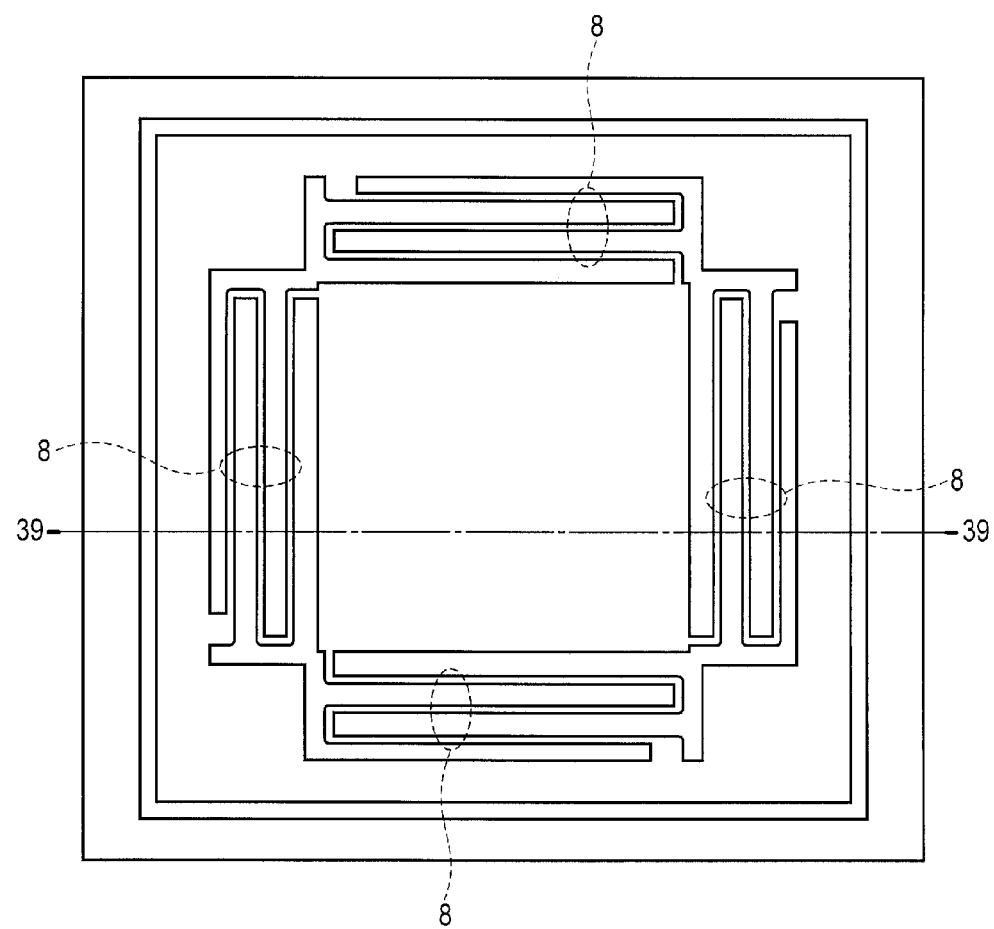
F I G. 38

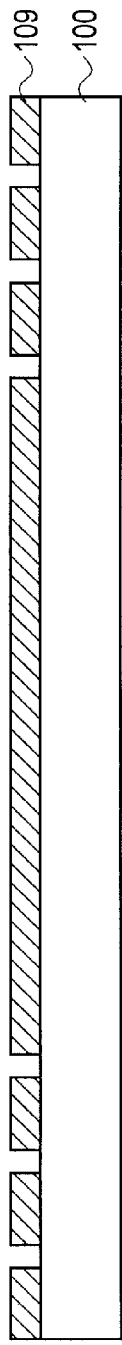
F I G. 40
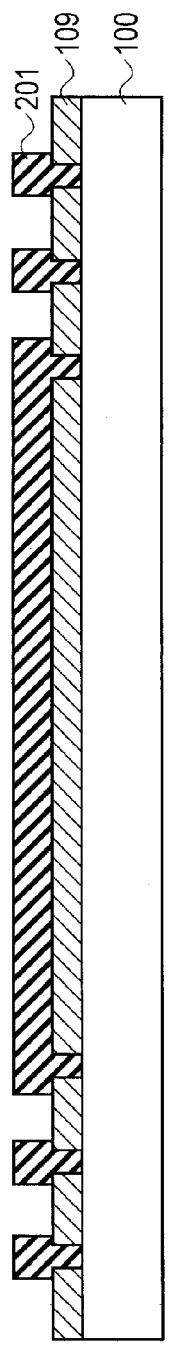
F I G. 41
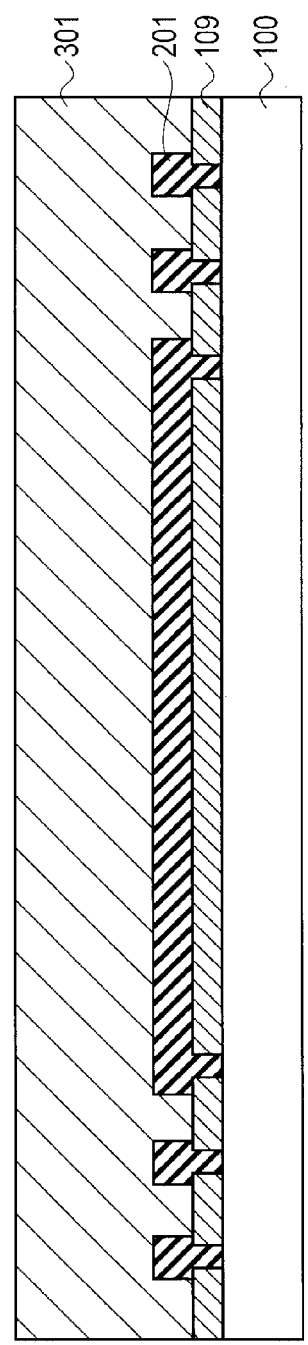
F I G. 42

SENSOR AND ITS MANUFACTURING METHOD

CROSS-REFERENCE TO RELATED APPLICATIONS

This application is based upon and claims the benefit of priority from Japanese Patent Application No. 2014-264677, filed Dec. 26, 2014, the entire contents of which are incorporated herein by reference.

FIELD

Embodiments described herein relate generally to a sensor and its manufacturing method.

BACKGROUND

Sensors in which micro-electromechanical systems (MEMS) technology is used to detect physical quantities such as acceleration or pressure are known. Such MEMS sensors are manufactured using semiconductor microfabrication technology, which is advantageous in terms of size reduction.

BRIEF DESCRIPTION OF THE DRAWINGS

FIG. 2 is a view showing an example of a circuit configuration for performing differential detection on change $\Delta C$ of capacitance;

FIG. 3 is a plan view for describing a specific structure of the sensor according to the first embodiment;

FIG. 5 is a sectional view for describing a method for manufacturing the sensor according to the first embodiment;

FIG. 31 is a sectional view for describing the manufacturing method, subsequent to FIG. 30, of the sensor according to the fourth embodiment;

FIG. 32 is a sectional view for describing the manufacturing method, subsequent to FIG. 31, of the sensor according to the fourth embodiment;

FIG. 35 is a sectional view for describing the manufacturing method, subsequent to FIG. 34, of the sensor according to the fourth embodiment;

FIG. 36 is a sectional view for describing the manufacturing method, subsequent to FIG. 35, of the sensor according to the fourth embodiment;

FIG. 37 is a view schematically showing a structure of a sensor according to a fifth embodiment;

FIG. 38 is a plan view for describing a specific structure of the sensor according to the fifth embodiment;

FIG. 40 is a sectional view for describing a method for manufacturing the sensor according to the fifth embodiment;

FIG. 41 is a sectional view for describing the manufacturing method, subsequent to FIG. 40, of the sensor according to the fifth embodiment;

FIG. 42 is a sectional view for describing the manufacturing method, subsequent to FIG. 41, of the sensor according to the fifth embodiment;

DETAILED DESCRIPTION

In general, according to one embodiment, a sensor is disclosed. The sensor includes a substrate, a first fixed electrode arranged on the substrate, a movable electrode arranged above the first fixed electrode and being movable non-parallely, a second fixed electrode arranged above the movable electrode. The sensor further includes a detector to detect a difference between a first capacitance between the first fixed electrode and the movable electrode and a second capacitance between the movable electrode and the second fixed electrode.

In general, according to another embodiment, a method for manufacturing a sensor is disclosed. The method includes forming a first layer comprising a first fixed electrode by patterning the first conductive layer, forming a first sacrificial film covering the first fixed electrode on a first layer, forming a second conductive layer on the first sacrificial film, forming a second layer comprising a movable electrode by patterning the second conductive layer. The method further includes forming a second sacrificial film covering the movable electrode, forming a third conductive layer on the second sacrificial film, forming a third layer comprising a second fixed electrode containing a through hole reaching the second sacrificial film by patterning the third conductive layer, and removing the first and second sacrificial films through the through hole of the second fixed electrode.

Embodiments will be hereinafter described with reference to the accompanying drawings. In the figures, the same portions or corresponding portions are denoted by the same reference numbers, and their description may be repeated when necessary.

First Embodiment

Figure 1:
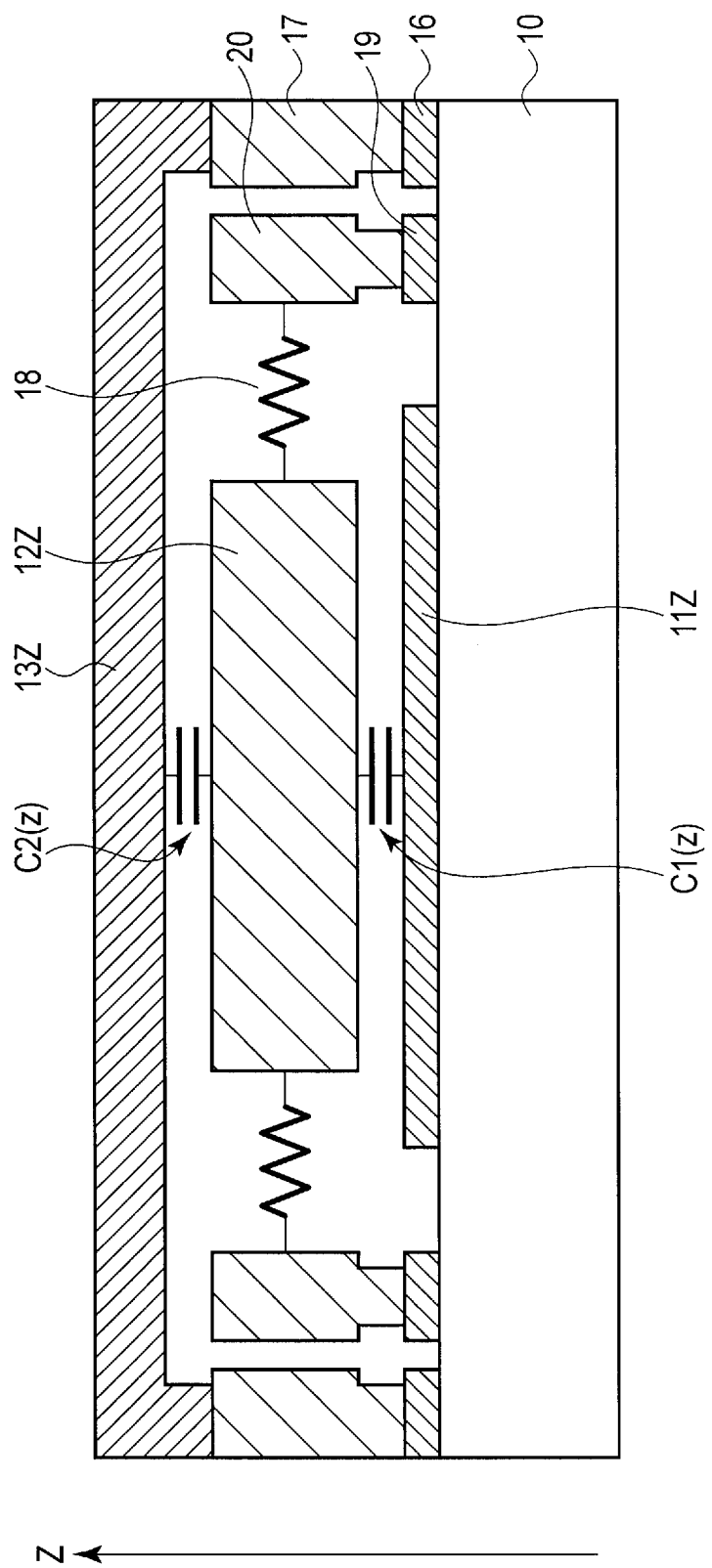
FIG. 1 is a view schematically showing a structure of a sensor according to a first embodiment.

FIG. 1 is a view schematically showing a structure of a sensor of the present embodiment. A sensor shown in FIG. 1 is a sensor (MEMS acceleration sensor) in which MEMS technology is used and is configured to detect acceleration in a height direction (Z-direction).

A first fixed electrode 11Z is arranged on the substrate 10. The first fixed electrode 11Z is fixed on the substrate 10.

A movable electrode 12Z which can be vertically (non-parallelly) moved is arranged above the first fixed electrode 11Z. The position of the movable electrode 12Z is displaced in an upper or a lower direction in accordance with change of inertial force in the Z-direction (direction perpendicular to the substrate 10). The movable electrode 12Z is connected to anchor portions 14A and 15A provided on the substrate 10 through a spring portion 18.

A second fixed electrode 13Z is arranged above the movable electrode 12Z. The second fixed electrode 13Z is fixed on the substrate 10 through anchor portions 16, 15B and 14B.

The first fixed electrode 11Z and the movable electrode 12Z constitute a first capacitor. The capacitance of the first capacitor is represented by $C1(z)$. The second fixed electrode 13Z and the movable electrode 12Z constitute a second capacitor. The capacitance of the second capacitor is represented by $C2(z)$.

When the acceleration in the Z-direction of the sensor changes, the position in the Z-direction of the movable electrode 12Z is displaced and change of the capacitance ($\Delta C = C1(z) - C2(z)$) changes. Since displacement (d) in the Z-direction of the movable electrode 12Z is obtained from $\Delta C$, the acceleration in the Z-direction can be obtained from the Hooke's law ($kd = m\alpha$, where k is the spring constant of the spring portion 18, m is the mass of the movable electrode 12Z and $\alpha$ is the acceleration).

Here, a facing area between the first fixed electrode 11Z and the movable electrode 12Z is equal to that between the second fixed electrode 13Z and the movable electrode 12Z. Further, permittivity between the first fixed electrode 11Z and the movable electrode 12Z is equal to that between the second fixed electrode 13Z and the movable electrode 12Z. $C1(z)$ and $C2(z)$ are given by $$C1(z) = \epsilon A/(d+z) + \Delta C1$$

$$C2(z) = \epsilon A/(d-z) + \Delta C2$$

where A is the facing area, $\epsilon$ is the permittivity, d is the displacement in the Z-direction of the movable electrode 12Z, $\Delta C1$ is the offset of C1 and $\Delta C2$ is the offset of C2.

Since $\Delta C1$ and $\Delta C2$ are considered substantially equal to each other, change $\Delta C$ of the capacitance is given by approximately $(\epsilon A/d)(2z/d)$.

An offset can be cancelled by performing differential detection on change $\Delta C$ of the capacitance; thus the detection accuracy of the sensor can be improved. Further, since the MEMS technology is used in the sensor of the embodiment, the sensor can be downsized. An example of a circuit configuration for performing the differential detection on change $\Delta C$ of the capacitance is shown in FIG. 2. $-V \sin \omega t$ and $V \sin \omega t$ indicate voltages having opposite phases, and R indicates resistance. The voltages of the opposite phases ($-V \sin \omega t$, $V \sin \omega t$) are applied to capacitors C1 and C2, and a node between capacitors C1 and C2 and ground are connected to the input side of a differential amplifier 30. A resistance R is provided between an input of the negative side of the differential amplifier 30 and an output of the differential amplifier 30.

Figure 4:
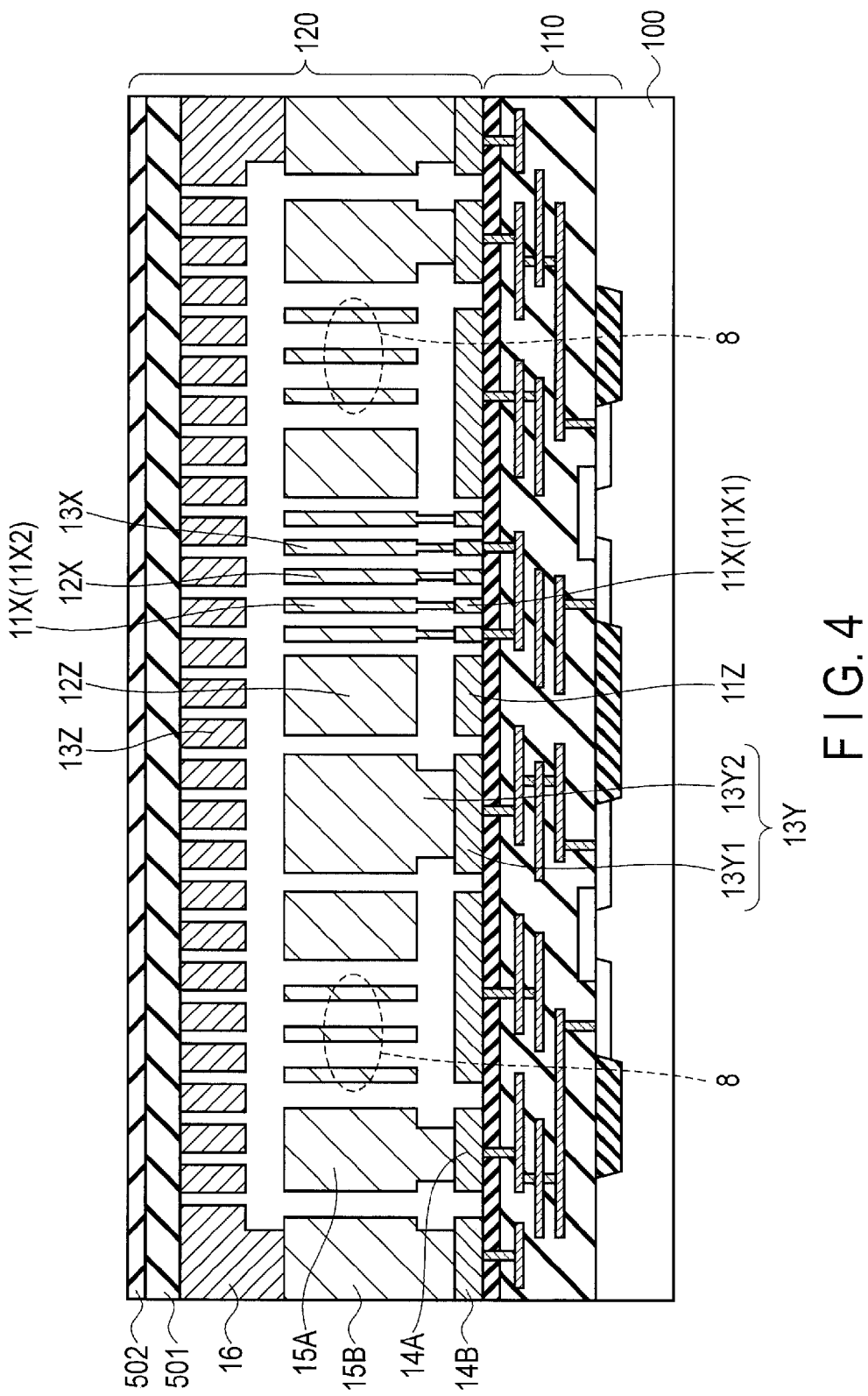
FIG. 4 is a sectional view taken along line 4-4 in the plan view of FIG. 3.

FIG. 3 is a plan view for describing a specific structure of the sensor of the present embodiment, and FIG. 4 is a sectional view taken along line 4-4 in the plan view of FIG. 3. This sensor includes not only a MEMS sensor configured to detect the acceleration in the Z-direction (hereinafter referred to as the Z-sensor), but also a MEMS sensor configured to detect the acceleration in the X-direction (horizontal direction) (hereinafter referred to as the X-sensor) and a MEMS sensor configured to detect the acceleration in the Y-direction (perpendicular direction) (hereinafter referred to as the Y-sensor).

As shown in FIG. 4, the sensor of the present embodiment includes a silicon substrate 100, a CMOS integrated circuit 110 located on the silicon substrate 100, and a MEMS sensor 120 located on the CMOS integrated circuit 110. The CMOS integrated circuit 110 includes a circuit for performing differential detection on change ΔC of the capacitance as shown in FIG. 2.

11X, 12X and 13X indicate a first fixed electrode, a movable electrode and a second fixed electrode of the X-sensor, respectively, and correspond to the first fixed electrode 11Z, the movable electrode 12Z and the second fixed electrode 13Z of the Z-sensor, respectively. The movable electrode 12X is arranged in the same layer as the movable electrode 12Z. The first fixed electrode 11X, the movable electrode 12X and the second fixed electrode 13X are arranged on an X-Y surface, and the movable electrode 12X is displaced in the X-direction in accordance with the change of the inertial force of the X-direction. The first fixed electrode 11X has a laminated structure of electrodes 11X1 and 11X2.

11Y, 12Y and 13Y indicate a first fixed electrode, a movable electrode and a second fixed electrode of the Y-sensor, respectively, and correspond to the first fixed electrode 11Z, the movable electrode 12Z and the second fixed electrode 13Z of the Z-sensor, respectively. The movable electrode 12Y is arranged in the same layer as movable electrode 12Z. The first fixed electrode 11Y, the movable electrode 12Y and the second fixed electrode 13Y are arranged on the X-Y surface, and the movable electrode 12Y is displaced in the Y-direction in accordance with the change of the inertial force of the Y-direction. The second fixed electrode 13X has a laminated structure of electrodes 13X1 and 13X2.

The second fixed electrode 13Z of the Z-sensor includes a plurality of through holes. A first insulating film 501 and a second insulating film 502 are sequentially provided on the second fixed electrode 13Z. The first and second insulating films 501 and 502 face the plurality of through holes of the second fixed electrode 13Z which are filled by the first and second insulating films 501 and 502.

The sensor of the present embodiment will be hereinafter further described in accordance with the manufacturing method thereof.

[FIG. 5]

The CMOS integrated circuit 110 is formed on the silicon substrate 100 by a well-known method. In FIG. 5, 102 denotes an isolation region, 103 denotes a gate (gate electrode, gate insulating film), 104 denotes a source/drain region, 105 denotes an insulating film, 106 denotes a contact plug, 107 denotes interconnect, and 108 denotes an insulating film.

A SiGe layer (first layer) 109 with impurities is formed on the CMOS integrated circuit 110, and then, the SiGe layer 109 is patterned into a predetermined shape in a photolithography process and an etching process. After the SiGe layer 109 is patterned, a part of the insulating film 108 is exposed. The patterned SiGe layer 109 includes the electrodes 11X1, 11Z and 13Y1 and anchor portions 14A and 14B shown in FIG. 4.

Another Si system semiconductor layer such as an amorphous Si layer may be used instead of the SiGe layer 109. The amorphous Si layer can be formed at a temperature lower than the SiGe layer 109.

[FIG. 6]

In the following figures, the silicon substrate 100 and CMOS integrated circuit 110 in FIG. 5 are collectively shown as one silicon substrate 100 for simplicity.

A sacrificial film 201 is formed on the substrate 100 and the SiGe layer 109, and the surface of the sacrificial film 201 is planarized by CMP process. Then, the sacrificial film 201 is patterned using photolithography process and etching process.

After the sacrificial film 201 is patterned, a part of the SiGe layer 109 (region in which the anchor portions 15A and 15B, an electrode 13Y2, etc., are to be formed) is exposed. The sacrificial film 201 is, for example, a silicon oxide film.

[FIG. 7]

A SiGe layer (second layer) 301 is formed on the SiGe layer 109 and the sacrificial film 201, and then, the surface of the SiGe layer 301 is planarized. The SiGe layer 301 is formed by, for example, CVD process, and the surface of SiGe layer 301 is planarized by, for example, by CMP process. As will be described later, a movable electrode can be obtained by patterning the SiGe layer 301. To increase sensitivity of a sensor, a movable electrode used as a weight is desirably heavy. Accordingly, the SiGe layer 301 is desirably thick. The thickness of the SiGe layer 301 is, for example, greater than or equal to 20 μm. Another Si system semiconductor layer may be used instead of the SiGe layer 301 as well as the case of the SiGe layer 109.

[FIG. 8]

The SiGe layer 301 is patterned using photolithography process and etching process. The patterned SiGe layer 301 includes the electrodes 11X2, 12X, 12Z, 13X and 13Y2, the anchor portions 15A and 15B and the spring portion 18 shown in FIG. 4. After the SiGe layer 301 is patterned, a part of the sacrificial film 201 is exposed.

[FIG. 9]

A sacrificial film 202 is formed on the sacrificial film 201 and the SiGe layer 301, and the surface of sacrificial film 202 is planarized by CMP process. Then, the sacrificial film 202 is patterned using photolithography process and etching process. After the sacrificial film 202 is patterned, a part of the SiGe layer 301 (region in which the anchor portion 16 is to be formed) is exposed. The sacrificial film 202 is, for example, a silicon oxide film.

[FIG. 10]

A SiGe layer (third layer) 401 is formed on the sacrificial film 202 and the SiGe layer 301, and then, the surface of the SiGe layer 401 is planarized. To shorten the formation time of the SiGe layer 401, the SiGe layer 401 is desirably thin. The thickness of the SiGe layer is, for example, less than or equal to 5 μm. Another Si system semiconductor layer may be used instead of the SiGe layer 401 as well as the case of the SiGe layer 109.

[FIG. 11]

The SiGe layer 401 is patterned using photolithography process and etching process. The patterned SiGe layer 401 includes the second fixed electrode 13Z including the plurality of through holes and the anchor portion 16 shown in FIG. 4. The sacrificial film 202 is exposed to the bottoms of the plurality of through holes.

[FIG. 12]

Hydrogen fluoride gas (HF gas) not shown is introduced from the through holes of the SiGe layer 401, and the sacrificial films 201 and 202 are removed. The gas for removing the sacrificial films 201 and 202 is not limited to HF gas.

Then, insulating films 501 and 502 are sequentially formed on the SiGe layer 401, and the sensor shown in FIG. 4 is obtained. The insulating films 501 and 502 are used as cap films for filling the through holes of SiGe layer 401. The insulating film 501 is, for example, a polyimide film or a silicon oxide film. To play a role as a moisture prevention film, the insulating film 502 desirably has lower gas permeability (higher moisture-proof property) than the insulating film 501. Then, for example, a silicon nitride film is used as the insulating film 502.

Figure 6:
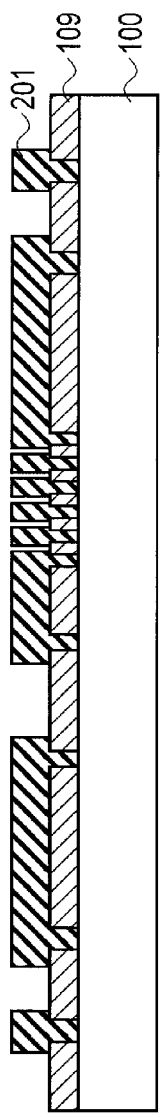
FIG. 6 is a sectional view for describing the manufacturing method, subsequent to FIG. 5, of the sensor according to the first embodiment.
Figure 7:
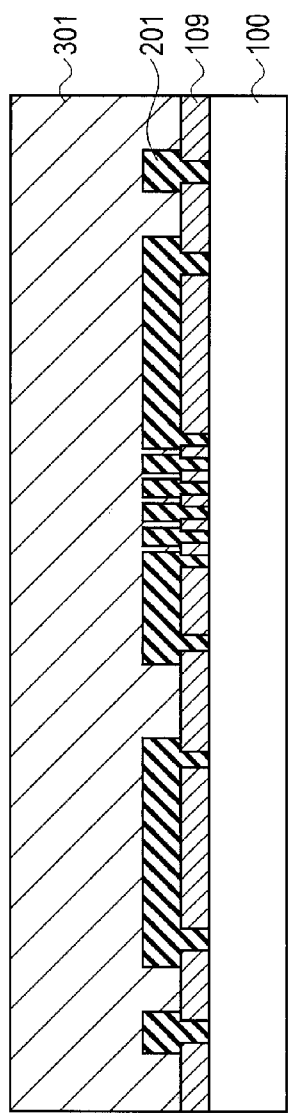
FIG. 7 is a sectional view for describing the manufacturing method, subsequent to FIG. 6, of the sensor according to the first embodiment.
Figure 8:
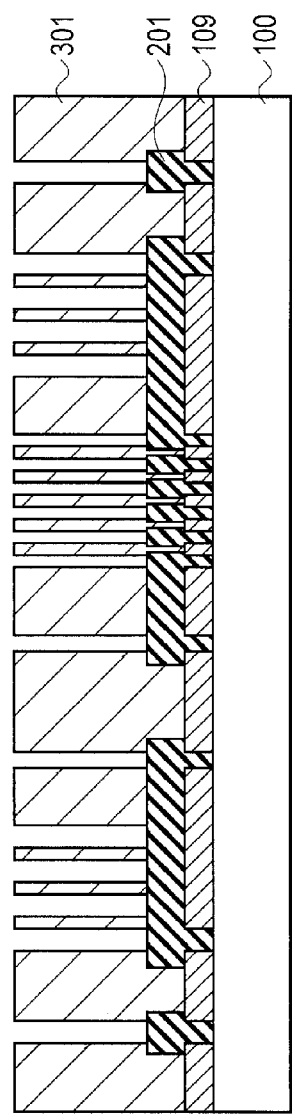
FIG. 8 is a sectional view for describing the manufacturing method, subsequent to FIG. 7, of the sensor according to the first embodiment.
Figure 9:
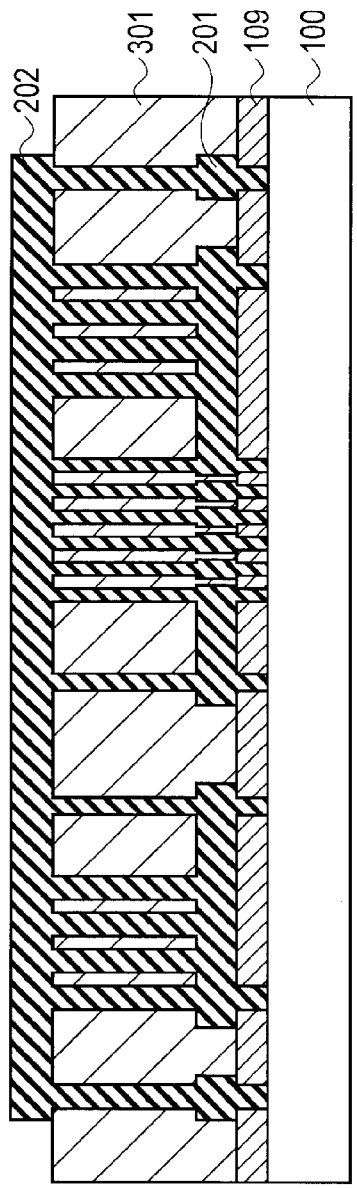
FIG. 9 is a sectional view for describing the manufacturing method, subsequent to FIG. 8, of the sensor according to the first embodiment.
Figure 10:
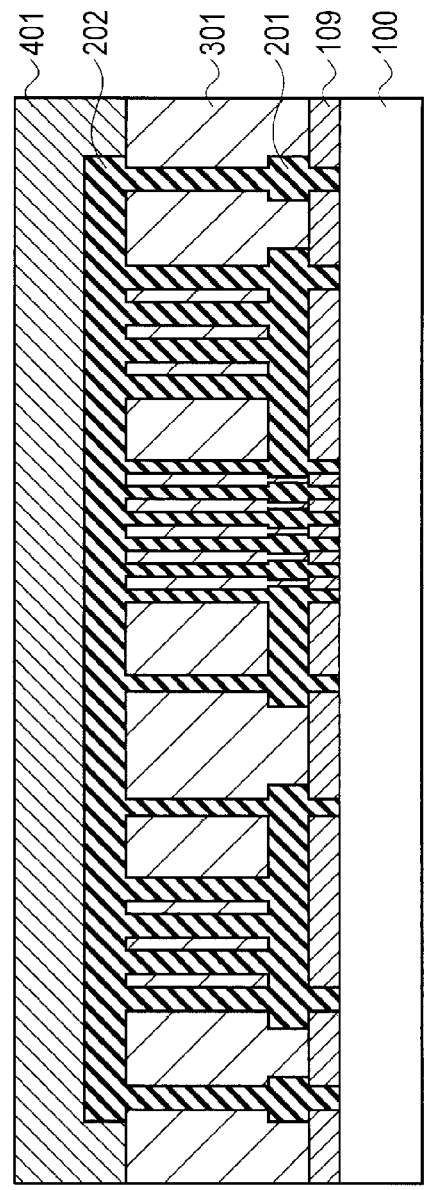
FIG. 10 is a sectional view for describing the manufacturing method, subsequent to FIG. 9, of the sensor according to the first embodiment.
Figure 11:
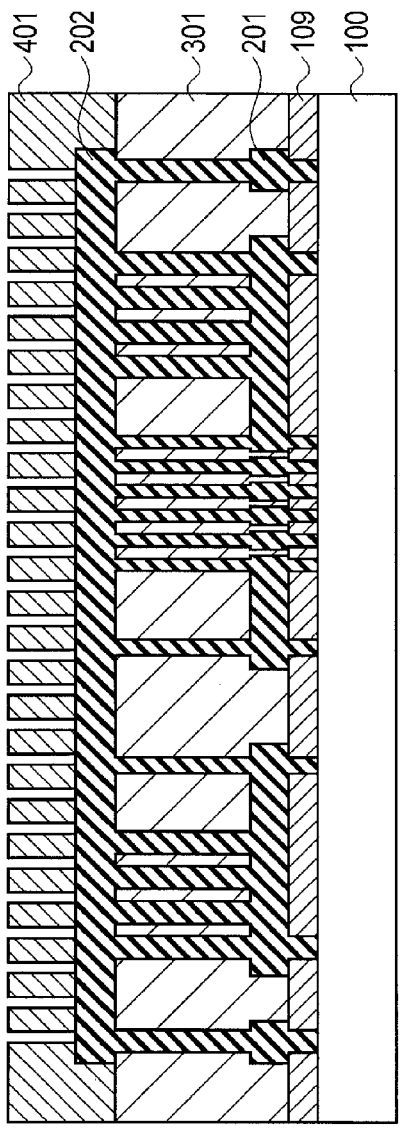
FIG. 11 is a sectional view for describing the manufacturing method, subsequent to FIG. 10, of the sensor according to the first embodiment.
Figure 12:
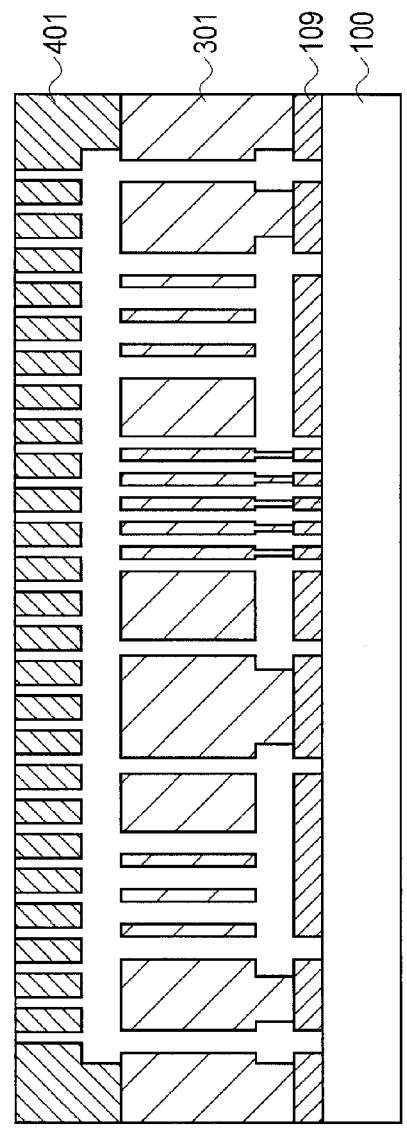
FIG. 12 is a sectional view for describing the manufacturing method, subsequent to FIG. 11, of the sensor according to the first embodiment.
Figures 13, 14:
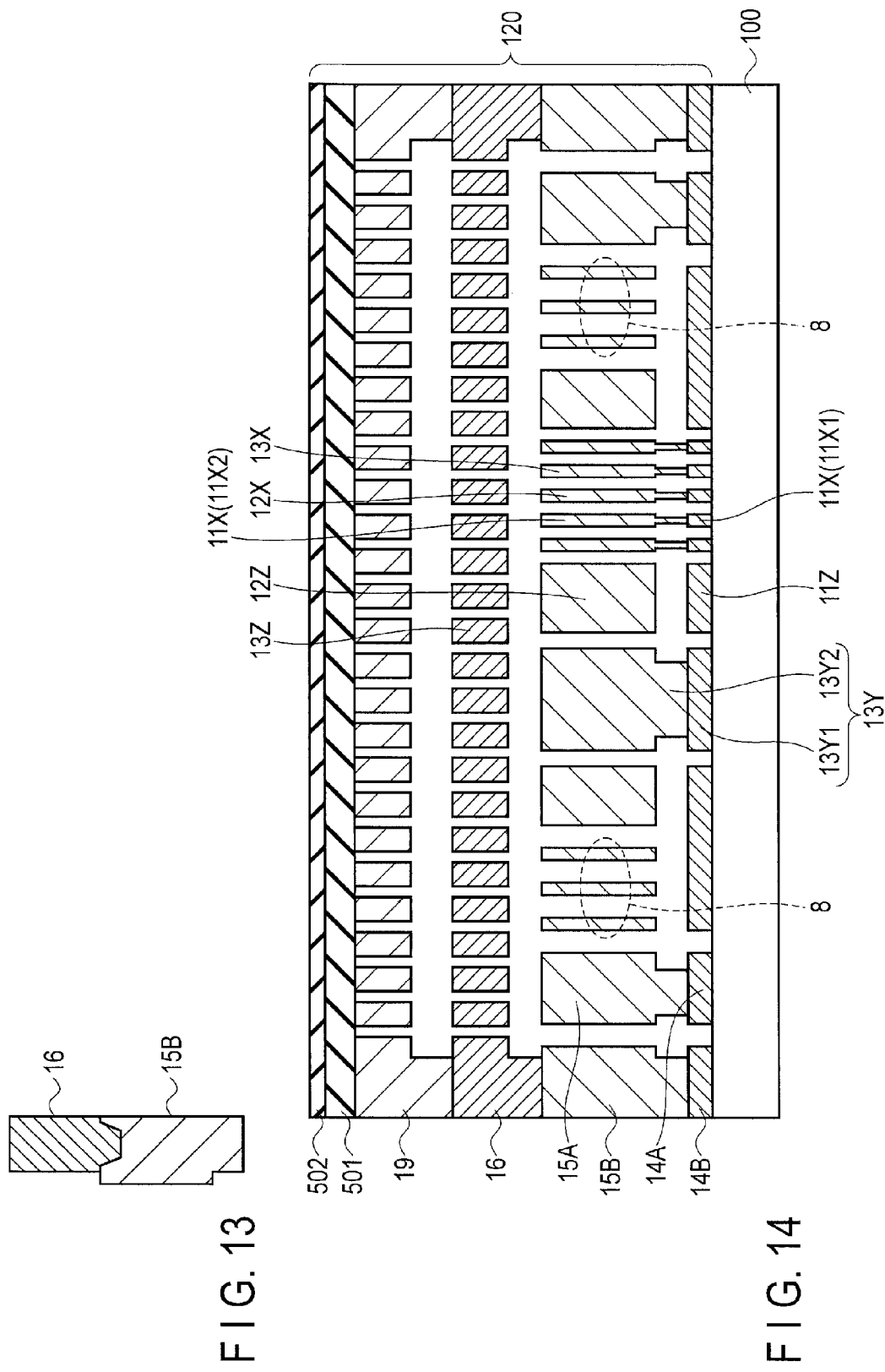
FIG. 13 is a sectional view for describing a modified example of the sensor according to the first embodiment.
FIG. 14 is a view showing a structure of the sensor of a second embodiment.

It should be noted that the sacrificial film 202 may be patterned to form a concave portion at an end portion of the upper surface of the SiGe layer 301 (region in which the anchor portion 16 is to be formed). In this case, the lower end of the anchor portion 16 can be fitted to the upper surface of the anchor portion 15B, as shown in FIG. 13. Thus, the connection strength between the anchor portions 15B and 16 can be enhanced. Similarly, the sacrificial film 201 may be patterned to form a concave portion at an end portion of the surface of the SiGe layer 109 in FIG. 6.

Second Embodiment

Figure 15:
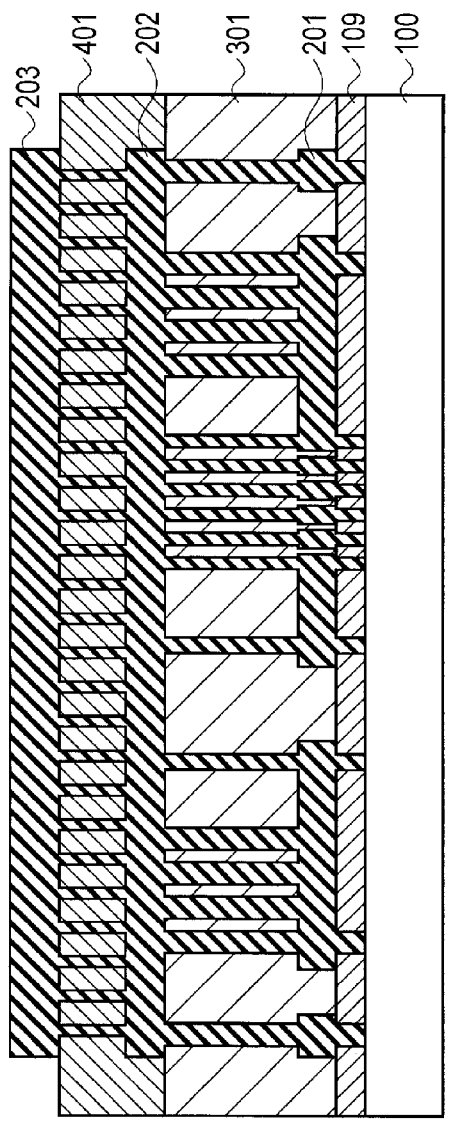
FIG. 15 is a sectional view for describing a method for manufacturing the sensor according to the second embodiment.
Figure 16:
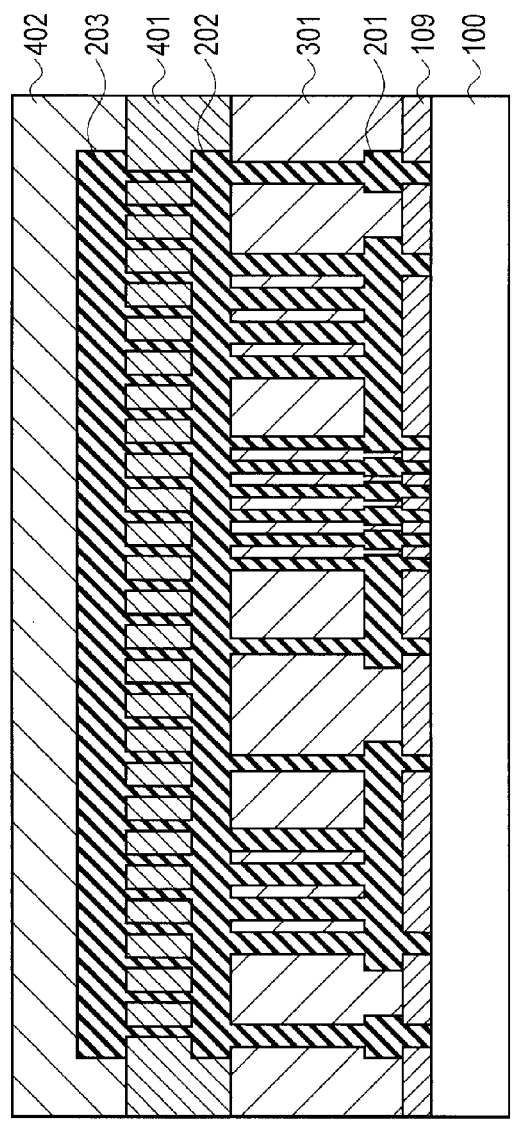
FIG. 16 is a sectional view for describing the manufacturing method, subsequent to FIG. 15, of the sensor according to the second embodiment.
Figure 17:
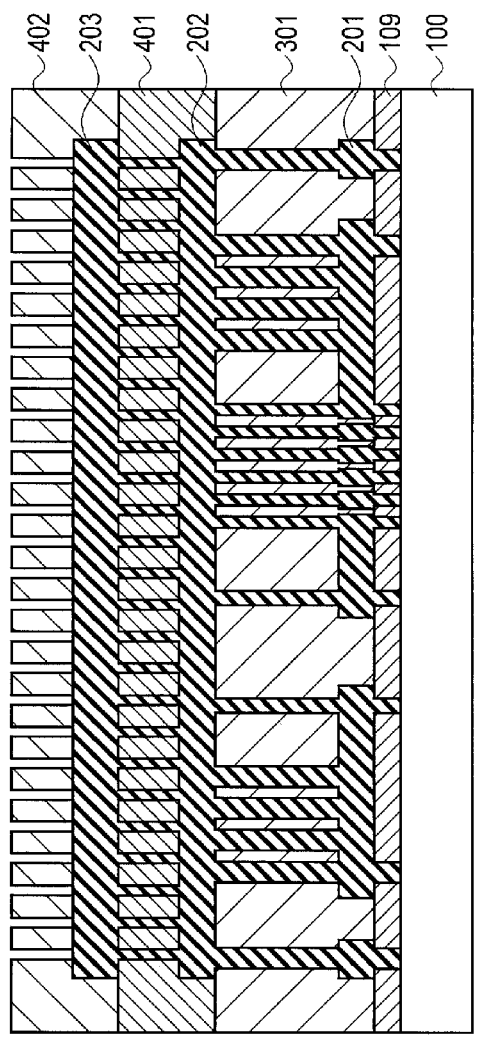
FIG. 17 is a sectional view for describing the manufacturing method, subsequent to FIG. 16, of the sensor according to the second embodiment.
Figure 18:
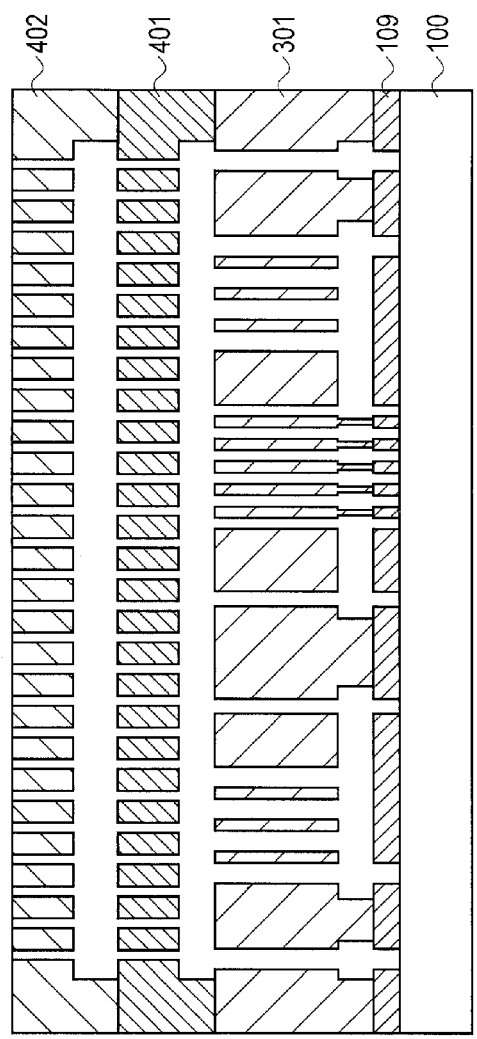
FIG. 18 is a sectional view for describing the manufacturing method, subsequent to FIG. 17, of the sensor according to the second embodiment.

FIG. 14 is a sectional view showing a structure of a sensor of the present embodiment. FIG. 15 is a sectional view corresponding to FIG. 4 in the first embodiment.

The sensor of the present embodiment is different from that of the first embodiment in that it further comprises a ceiling portion 17 arranged above the fixed electrode 13Z and including a plurality of through holes, and an anchor portion 19 provided on an anchor portion 16 and a supporting the ceiling portion 17, and insulating films 501 and 502 are provided on the ceiling portion 17.

That is, while insulating films 501 and 502 directly contact SiGe layer 401 in the first embodiment, neither of them directly contacts SiGe layer 401 in the present embodiment. Accordingly, the fixed electrode 13Z is prevented from being curved due to the difference of thermal expansion between the insulating films 501 and 502 and the SiGe layer 401.

The sensor of the present embodiment will be hereinafter further described in accordance with the manufacturing method thereof.

First, the processes of FIGS. 5-11 described in the first embodiment are performed.

[FIG. 15]

Thereafter, a sacrificial film 203 is formed on the sacrificial film 202 and the SiGe layer 401, and the surface of the sacrificial film 203 is planarized by CMP process. Then, the sacrificial film 203 is patterned using photolithography process and etching process. After the sacrificial film 203 is patterned, a part of the SiGe layer 401 (region in which the anchor portion 19 is to be formed) is exposed. The sacrificial film 203 is, for example, a silicon oxide film.

[FIG. 16]

A SiGe layer 402 is formed on the sacrificial film 203 and the SiGe layer 401, and then, the surface of the SiGe layer 402 is planarized. The SiGe layer 402 is formed by, for example, CVD process, and the surface of the SiGe layer 402 is planarized by, for example, CMP process. Another Si system semiconductor layer may be used instead of the SiGe layer 402 as well as the case of the SiGe layer 109.

[FIG. 17]

The SiGe layer 402 is patterned using photolithography process and etching process. The patterned SiGe layer 402 includes the ceiling portion 17 having the plurality of through holes and the anchor portion 19 shown in FIG. 14.

[FIG. 18]

Gas for example HF gas is introduced from the through holes of SiGe layer 402, and the sacrificial films 201 to 203 are removed.

Then, the insulating films 501 and 502 are sequentially formed on the SiGe layer 402, and the sensor shown in FIG. 14 is obtained.

Figures 19, 20:
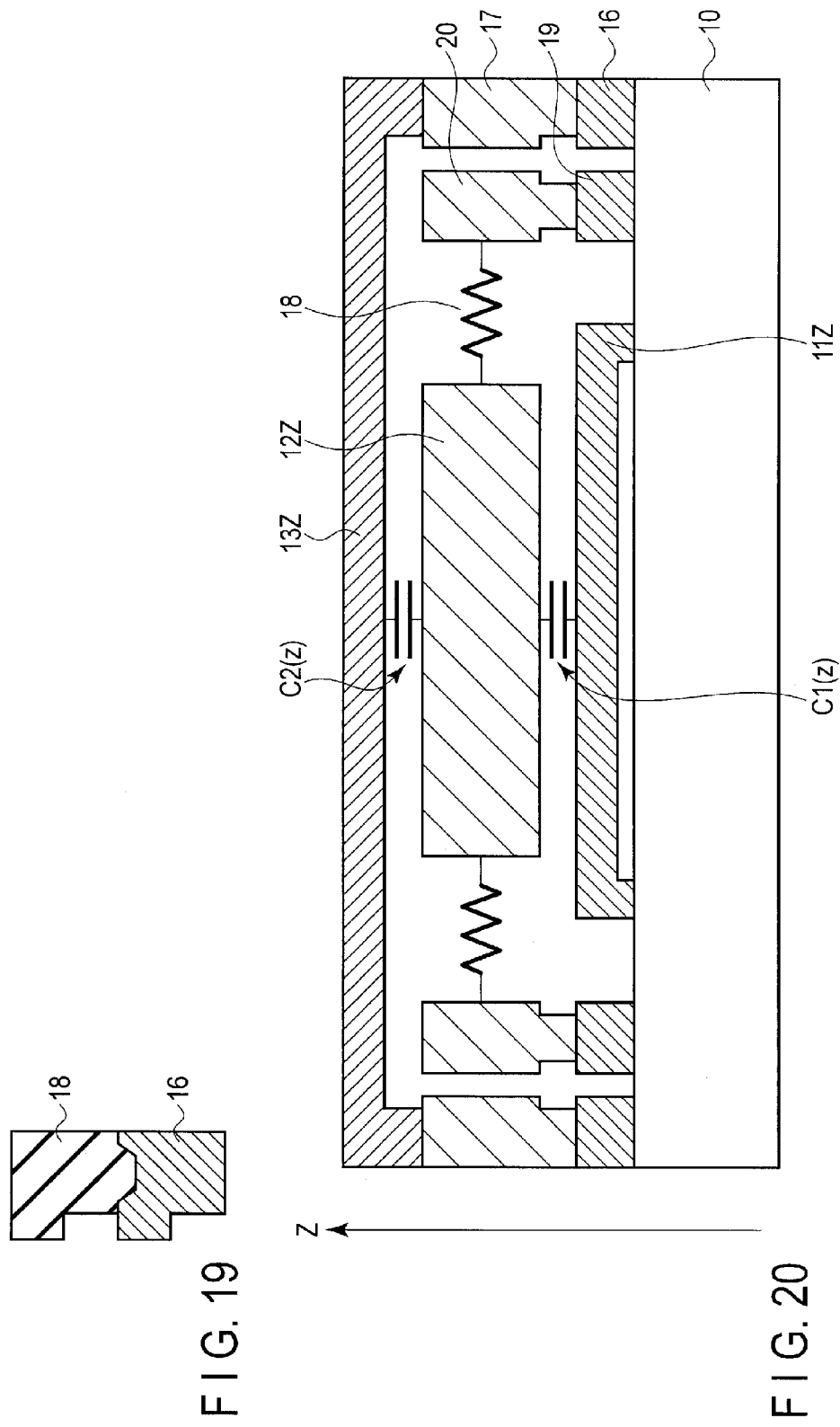
FIG. 19 is a sectional view for describing a modified example of the sensor according to the second embodiment.
FIG. 20 is a view schematically showing a structure of a sensor according to a third embodiment.

It should be noted that the sacrificial film 203 may be patterned to form a concave portion at an end portion of the surface of the SiGe layer 401 (region in which anchor portion 19 is to be formed) in FIG. 15. In this case, the lower end of the anchor portion 19 can be fitted to the upper surface of the anchor portion 16, as shown in FIG. 19. Thus, the connection strength between the anchor portions 16 and 19 can be enhanced. Further, a concave portion may be formed on the surface of each of the SiGe layers 109 and 301, as described in the first embodiment.

Third Embodiment

FIG. 20 is a sectional view showing a structure of a sensor of the present embodiment. FIG. 20 is a sectional view corresponding to FIG. 14 in the second embodiment.

The sensor of the present embodiment is different from that of the first embodiment in that a cavity is present between the fixed electrode 11Z and the substrate 100. The fixed electrode 11Z includes a through hole connected to the cavity. That is, a contact area between fixed electrode 11Z and substrate 100 is reduced in the present embodiment. This prevents the fixed electrode 11Z from being curved due to the difference of thermal expansion between the fixed electrode 11Z and the substrate 100. The present embodiment may be applied to the second embodiment.

Further, the fixed electrode 11Z on the cavity is as thick as the fixed electrode 13Z in the present embodiment. In this case, even when the fixed electrodes 11Z and 13Z are curved, the extent of the curve will be substantially equal between them. Accordingly, the distance between the fixed electrodes 11Z and 13Z is kept substantially fixed.

Furthermore, when the fixed electrodes 11Z and 13Z and movable electrode 12Z are made substantially as thick as each other, the degree of curve will be substantially equal between them even when they are curved. As a result, the capacitance between the fixed electrode 11Z and the movable electrode 12Z is substantially equal to that between the fixed electrode 13Z and the movable electrode 12Z. This is advantageous to perform differential detection.

The structure in which the cavity is present between the fixed electrode 11Z and the substrate 100 is realized by adopting the process in which the sacrificial film is used, as well as in, for example, the first and second embodiments. When such a process is used, the fixed electrode 11Z includes a first portion (main body of electrode) facing the movable electrode 12Z and including a through hole, and a second portion (supporting portion) provided on the substrate 10 and supporting the first portion.

Fourth Embodiment

Figure 21:
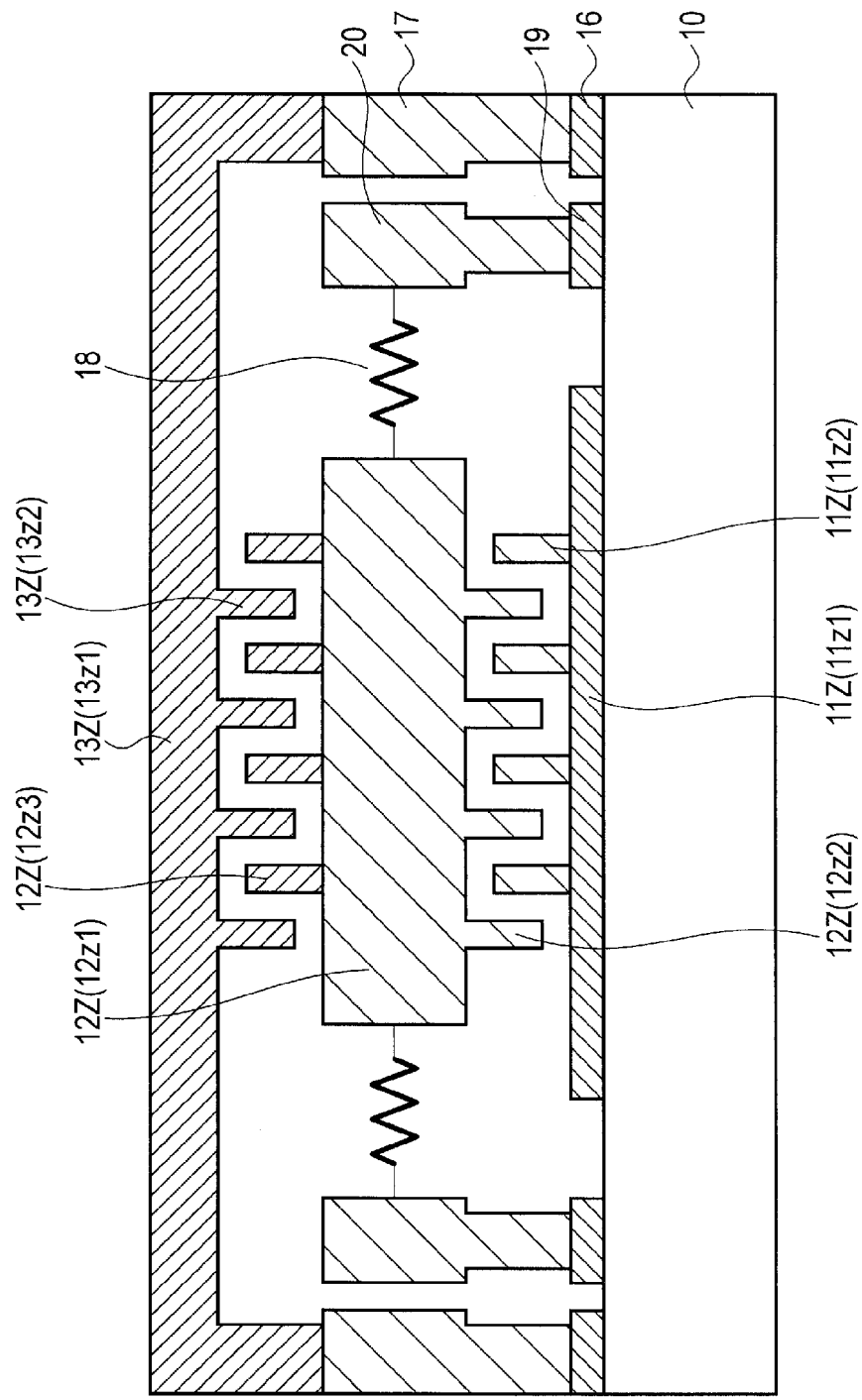
FIG. 21 is a view schematically showing a structure of a sensor according to a fourth embodiment.
Figure 22:
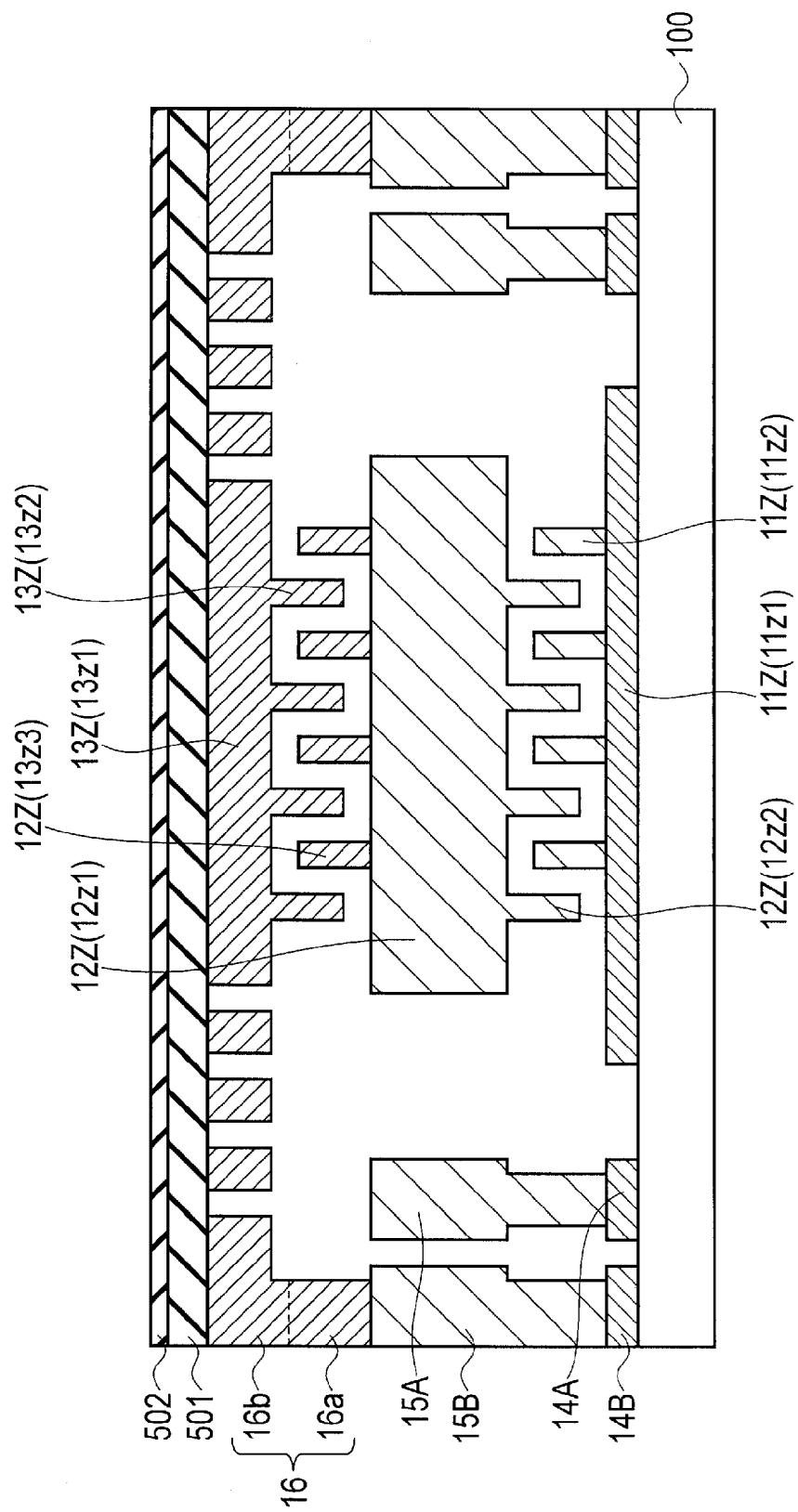
FIG. 22 is a sectional view showing a structure of the sensor according to the fourth embodiment.
Figure 23:
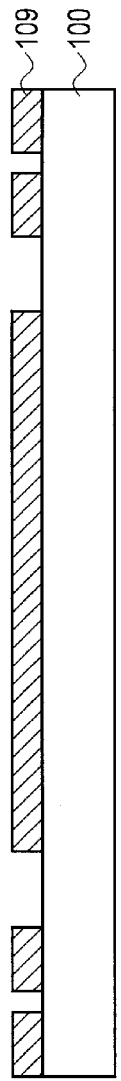
FIG. 23 is a sectional view for describing a method for manufacturing the sensor according to the fourth embodiment.
Figure 24:
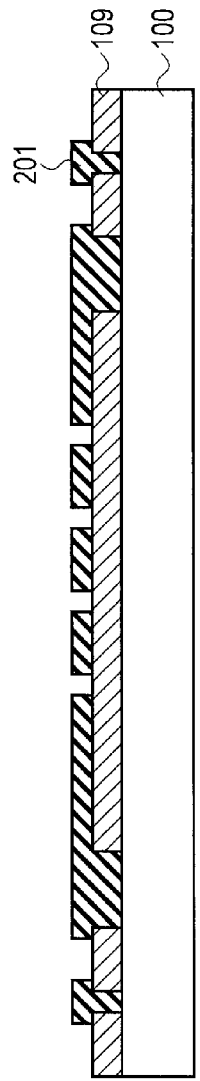
FIG. 24 is a sectional view for describing the manufacturing method, subsequent to FIG. 23, of the sensor according to the fourth embodiment.
Figure 25:
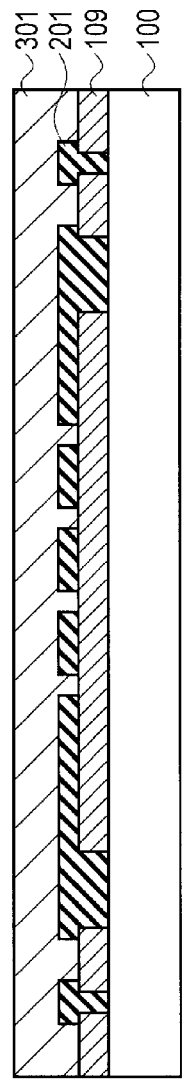
FIG. 25 is a sectional view for describing the manufacturing method, subsequent to FIG. 24, of the sensor according to the fourth embodiment.

FIG. 21 is a view schematically showing a structure of a sensor of the present embodiment. FIG. 21 is a sectional view showing a structure of a sensor of the present embodiment. FIG. 22 is a sectional view corresponding to FIG. 4 in the first embodiment. It should be noted that only a structure in the Z-direction is shown in FIG. 22 for simplicity.

The sensor of the present embodiment is different from those of the first to third embodiments in that the first fixed electrode 11Z, the movable electrode 12Z and the second fixed electrode 13Z are comb-shaped.

The first fixed electrode 11Z includes an electrode 11Z1 and a comb-shaped electrode 11z2 provided on the upper surface of the electrode 11Z1. The movable electrode 12Z includes an electrode 12Z1, a comb-shaped electrode 12Z2 provided on the lower surface of the electrode 12Z1 and a comb-shaped electrode 12z3 provided on the upper surface of the electrode 12Z1. The second fixed electrode 13Z includes an electrode 13Z1 and a comb-shaped electrode 13z2 provided on the lower surface of the electrode 13Z1.

The comb-shaped electrode 11z2 of the first fixed electrode 11Z and the comb-shaped electrode 12z2 of the movable electrode 12Z are arranged to be engaged with each other by a gap. As a result, the comb-shaped electrodes 11z2 and 12z2 constitute a capacitor. This causes the capacitance of the capacitor constituted of the first fixed electrode 11Z and the movable electrode 12Z to increase.

The comb-shaped electrode 13z2 of the second fixed electrode 13Z and the comb-shaped electrode 12z3 of the movable electrode 12Z are arranged to be engaged with each other by a gap. As a result, the comb-shaped electrodes 13z2 and 12z3 constitute a capacitor. This causes the capacitance of the capacitor constituted of the second fixed electrode 13Z and the movable electrode 12Z to increase.

The present embodiment allows the capacitance to be increased by the capacitor constituted of the comb-shaped electrode. Further, even when the size (area) of the movable electrode 12Z is reduced, necessary capacitance is easily secured, which causes the sensor to be reduced in size.

FIGS. 23-36 are sectional views showing a method for manufacturing the sensor of the present embodiment.

[FIG. 23]

The SiGe layer 109 is formed on the substrate 100, and then, the SiGe layer 109 is patterned to be in a predetermined shape. The patterned SiGe layer 109 includes the electrodes 11z1 and the anchor the portions 14A and 14B shown in FIG. 22.

[FIG. 24]

The sacrificial film 201 is formed on the substrate 100 and the SiGe layer 109, and the surface of the sacrificial film 201 is planarized by CMP process. Then, the sacrificial film 201 is patterned. After the sacrificial film 201 is patterned, a part of the SiGe layer 109 (region in which comb-shaped electrode 11z2 and the anchor portions 15A and 15B are to be formed) is exposed.

[FIG. 25]

The SiGe layer 301 is formed on the SiGe layer 109 and the sacrificial film 201, and then, the surface of the SiGe layer 301 is planarized.

[FIG. 26]

The SiGe layer 301 is patterned to be in the predetermined shape using photolithography process and etching process. The patterned SiGe layer 301 includes the comb-shaped electrode 11z2 shown in FIG. 22. The patterned SiGe layer 301 further includes a lower portion of the comb-shaped electrode 12z2 and lower portions of the anchor portions 15A and 15B shown in FIG. 22.

[FIG. 27]

The sacrificial film 202 is formed on the sacrificial film 201 and the SiGe layer 301, and then, the surfaces of the sacrificial film 201 and the SiGe layer 301 are planarized.

[FIG. 28]

The SiGe layer 301 is thinned by etching back. As a result, the upper surface of the SiGe layer 301 becomes lower than that of the sacrificial film 201, and a concave portion (difference in level) is produced.

[FIG. 29]

A SiGe layer 400 is formed on the sacrificial film 201 and the SiGe layer 301 such that the level difference (concave portion) is produced, and then, the surface of the SiGe layer 400 is planarized by CMP process.

[FIG. 30]

The SiGe layer 400 is patterned to be in the predetermined shape using photolithography process and etching process. The patterned SiGe layer 400 includes the electrodes 12z1 and 12z2 and the anchor portions 15A and 15B shown in FIG. 22.

[FIG. 31]

The sacrificial film 203 is formed on the sacrificial film 202 and the SiGe layer 400, and the surface of the sacrificial film 203 is planarized by CMP process. Then, the sacrificial film 203 is patterned. After the sacrificial film 203 is patterned, a part of the SiGe layer 400 (region in which electrode 12z3 and anchor portion 16a are to be formed) is exposed.

[FIG. 32]

A SiGe layer 401a is formed on the sacrificial film 203 and the SiGe layer 400, and then, the surface of the SiGe layer 401a is planarized by CMP process.

[FIG. 33]

The SiGe layer 401a is patterned to be in the predetermined shape using photolithography process and etching process. The patterned SiGe layer 401a includes the comb-shaped electrode 12z3 and the anchor portion 16a shown in FIG. 26. The patterned SiGe layer 401a further includes the lower side of the comb-shaped electrode 13z2 shown in FIG. 22.

[FIG. 34]

The sacrificial film 204 is formed on the sacrificial film 203 and the SiGe layer 401a, and the surface of the sacrificial film 204 is planarized by CMP process. Then, the sacrificial film 204 is patterned. After the sacrificial film 204 is patterned, a part of the SiGe layer 401a (region in which the upper side of comb-shaped electrode 13z2 and anchor portion 16b are to be formed) is exposed.

[FIG. 35]

A SiGe layer 401b is formed on the sacrificial film 204 and the SiGe layer 401a, and the surface of the SiGe layer 401b is planarized by CMP process. Then, the SiGe layer 401b is patterned. The patterned SiGe layer 401b includes the upper side of the comb-shaped electrode 13z2, the electrode 13z1 and the anchor portion 16a shown in FIG. 22. The patterned SiGe layer 401b further includes a plurality of through holes reaching the sacrificial film 204.

[FIG. 36]

HF gas is introduced from the through holes of the SiGe layer 401b, and the sacrificial films 201 to 204 are removed.

Figure 26:
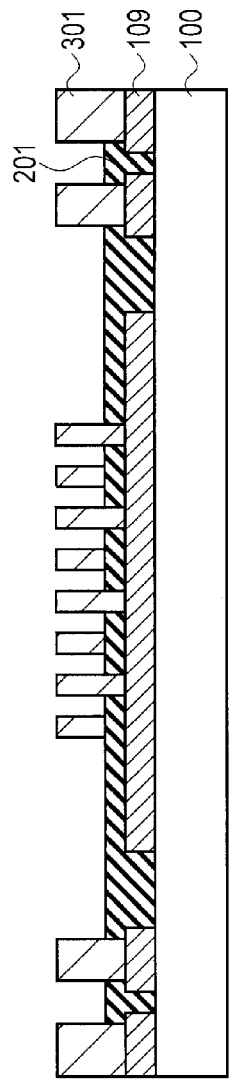
FIG. 26 is a sectional view for describing the manufacturing method, subsequent to FIG. 25, of the sensor according to the fourth embodiment.
Figure 27:
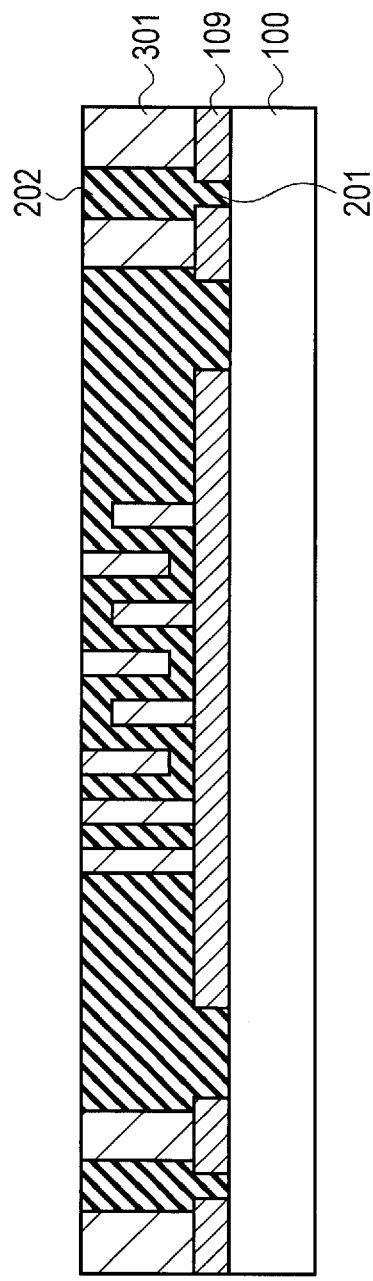
FIG. 27 is a sectional view for describing the manufacturing method, subsequent to FIG. 26, of the sensor according to the fourth embodiment.
Figure 28:
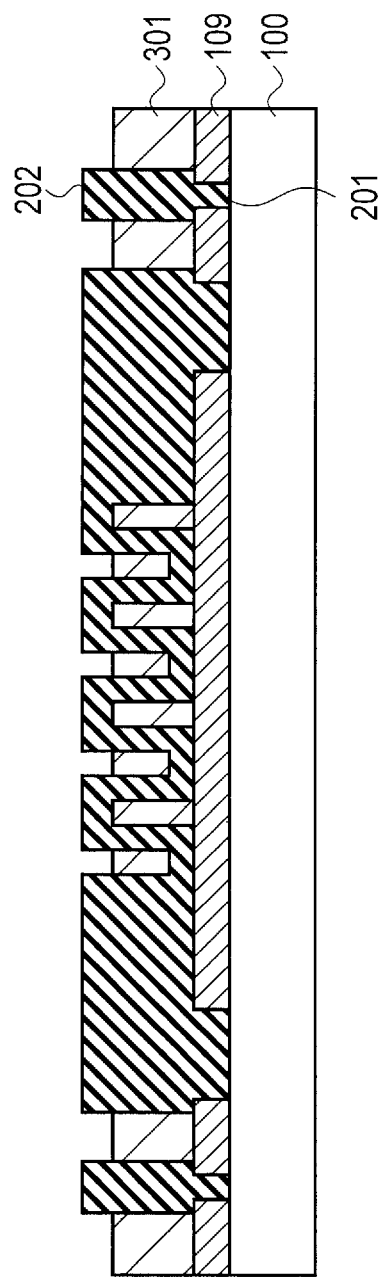
FIG. 28 is a sectional view for describing the manufacturing method, subsequent to FIG. 27, of the sensor according to the fourth embodiment.
Figure 29:
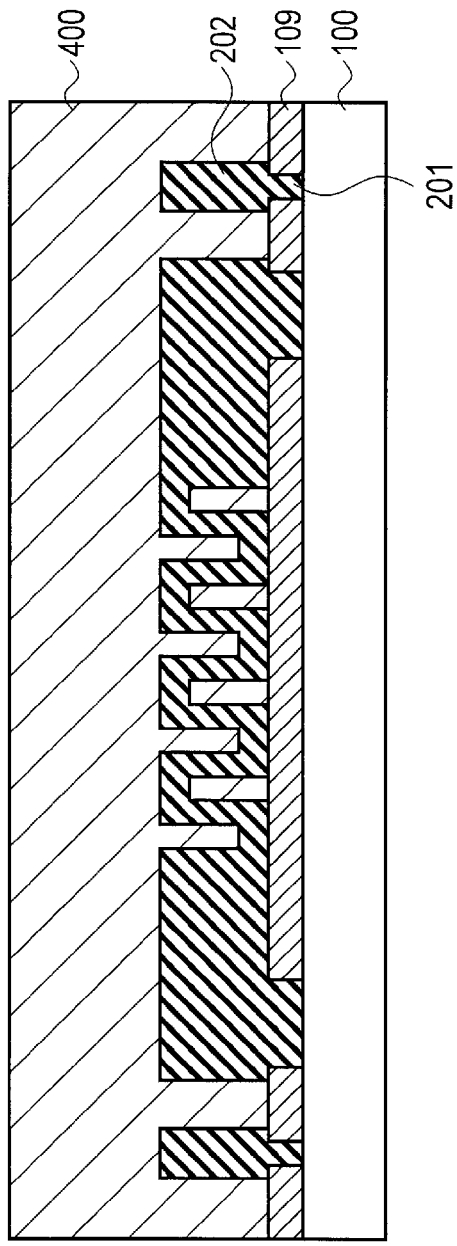
FIG. 29 is a sectional view for describing the manufacturing method, subsequent to FIG. 28, of the sensor according to the fourth embodiment.
Figure 30:
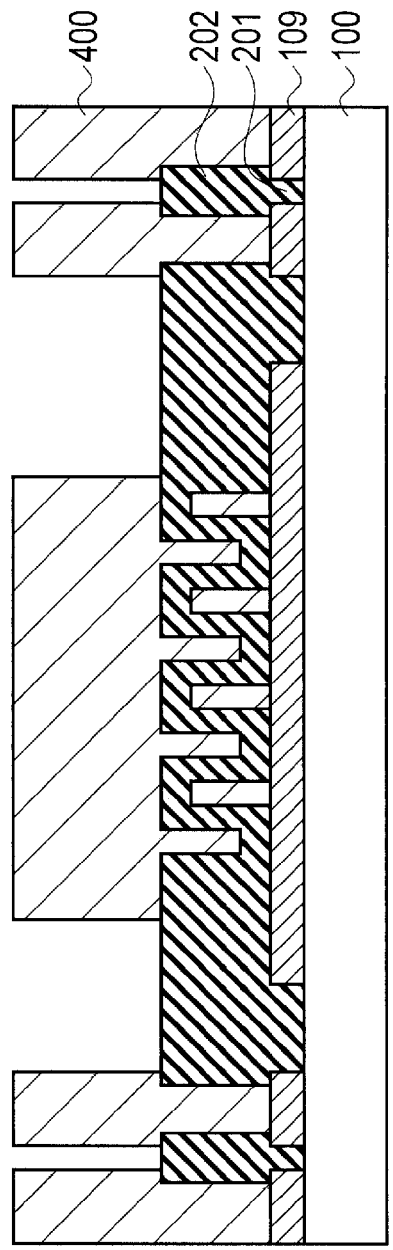
FIG. 30 is a sectional view for describing the manufacturing method, subsequent to FIG. 29, of the sensor according to the fourth embodiment.
Figure 33:
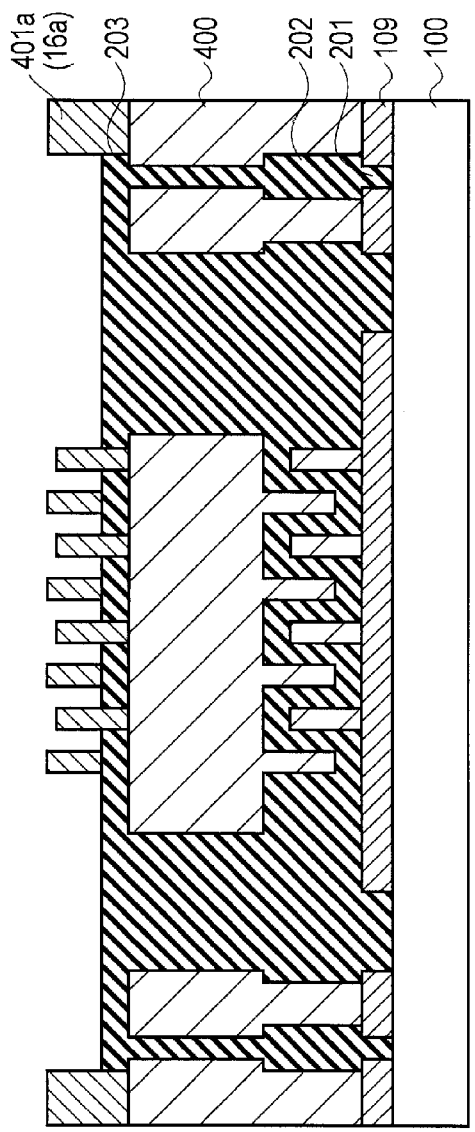
FIG. 33 is a sectional view for describing the manufacturing method, subsequent to FIG. 32, of the sensor according to the fourth embodiment.
Figure 34:
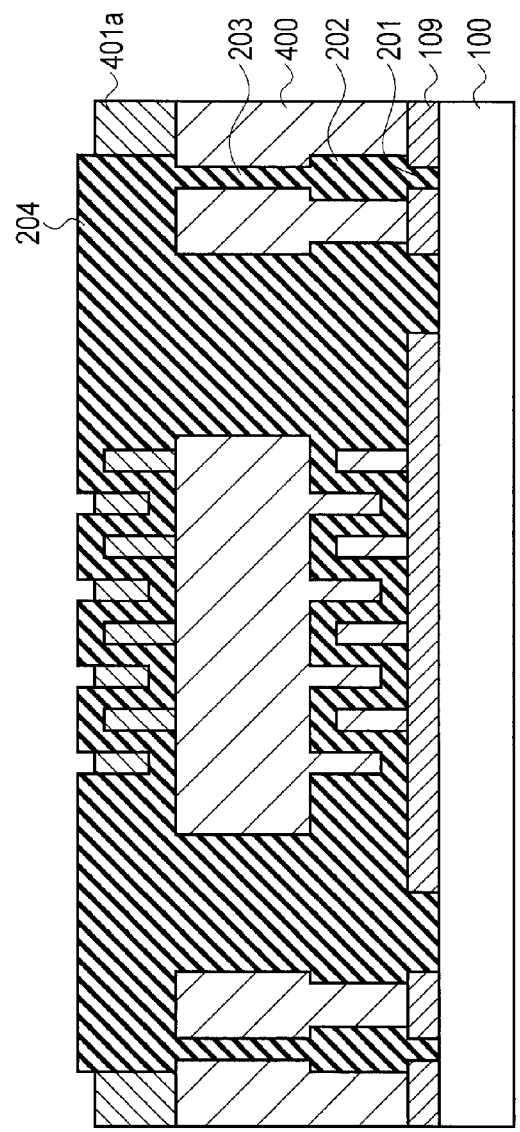
FIG. 34 is a sectional view for describing the manufacturing method, subsequent to FIG. 33, of the sensor according to the fourth embodiment.

Then, the insulating films 501 and 502 are sequentially formed on the SiGe layer 401b, and the sensor shown in FIG. 26 is obtained.

Fifth Embodiment

Figure 39:
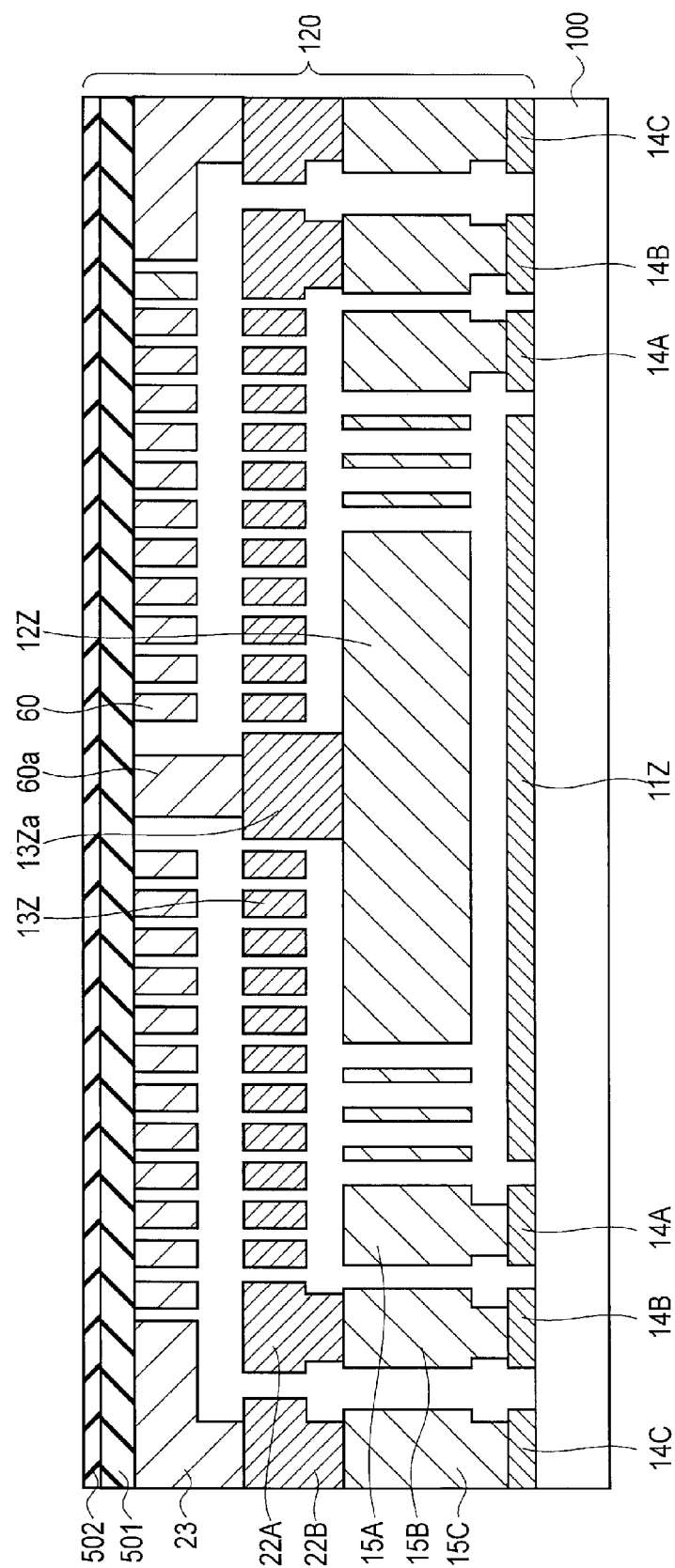
FIG. 39 is a sectional view taken along line 39-39 in the plan view of FIG. 38.

FIG. 37 is a view schematically showing a structure of a sensor of the present embodiment. The sensor shown in FIG. 37 is a pressure sensor (MEMS pressure sensor) in which MEMS technology is used. FIG. 38 is a plan view for describing a specific structure of the sensor of the present embodiment, and FIG. 39 is a sectional view taken along line 39-39 in the plan view of FIG. 38.

The sensor of the present embodiment includes a movable membrane (diaphragm) 60 which moves in accordance with change in pressure of outside air. The movable membrane 60 is connected to a movable electrode 12Z through connecting portions 60a and 13Za. Since the pressure applied to the movable membrane 60 is transmitted to the movable electrode 12Z, the position in the Z-direction of the movable electrode 12Z changes depending on the change in pressure. An offset can be cancelled by performing differential detection on change of the capacitance ($\Delta C = C1(z) - C2(z)$). Thus, the detection accuracy of the sensor can be improved, as well as in the first embodiment.

FIGS. 40-49 are sectional views for describing a method for manufacturing the sensor of the present embodiment.

[FIG. 40]

The SiGe layer 109 is formed on the substrate 100, and then, the SiGe layer 109 is patterned to be in a predetermined shape. The patterned SiGe layer 109 includes the fixed electrode 11Z and the anchor portions 14A, 14B and 14C shown in FIG. 43.

[FIG. 41]

The Sacrificial film 201 is formed on the substrate 100 and the SiGe layer 109, and the surface of the sacrificial film 201 is planarized. Then, the sacrificial film 201 is patterned. After the sacrificial film 201 is patterned, a part of the SiGe layer 109 (region in which the anchor portions 15A, 15B and 15C are to be formed) is exposed.

[FIG. 42]

SiGe layer 301 is formed on SiGe layer 109 and sacrificial film 201, and then, the surface of the SiGe layer 301 is planarized.

[FIG. 43]

The SiGe layer 301 is patterned to be in the predetermined shape using photolithography process and etching process. The patterned SiGe layer 301 includes the movable electrode 12Z and the anchor portions 15A, 15B and 15C shown in FIG. 39.

[FIG. 44]

The sacrificial film 202 is formed on the sacrificial film 201 and the SiGe layer 301, and the surface of the sacrificial film 202 is planarized. Then, the sacrificial film 202 is patterned using photolithography process and etching process. After the sacrificial film 202 is patterned, a part of the SiGe layer 301 (region in which anchor portions 22A and 22B and the connecting portion 13Za are to be formed) is exposed.

[FIG. 45]

SiGe the layer 401 is formed on the sacrificial film 202 and the SiGe layer 301, and then, the surface of the SiGe layer 401 is planarized.

[FIG. 46]

The anchor portions 22A and 22B, the electrode 13Z, the connecting portion 13Za and the fixed electrode 13Z which are constituted by the SiGe layer 401 and are shown in FIG. 39 are formed by patterning the SiGe layer 401 using photolithography process and etching process.

[FIG. 47]

The sacrificial film 203 is formed on the sacrificial film 202 and the SiGe layer 401, and then, the sacrificial film 203 is patterned. After the sacrificial film 203 is patterned, a part of the SiGe layer 401 (region in which anchor portion 23 and the connecting portion 60a are to be formed) is exposed.

[FIG. 48]

The SiGe layer 402 is formed on the sacrificial film 203 and the SiGe layer 401, and then, the surface of the SiGe layer 402 is planarized.

[FIG. 49]

Figure 43:
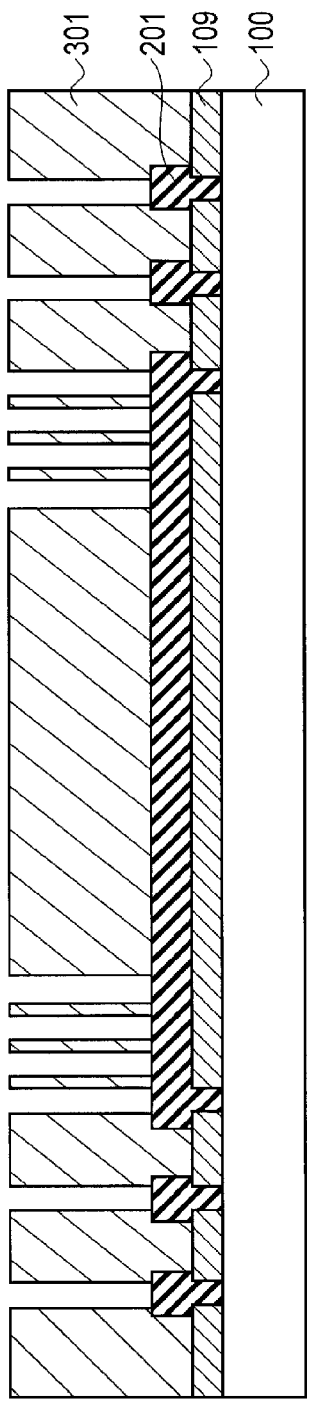
FIG. 43 is a sectional view for describing the manufacturing method, subsequent to FIG. 42, of the sensor according to the fifth embodiment.
Figure 44:
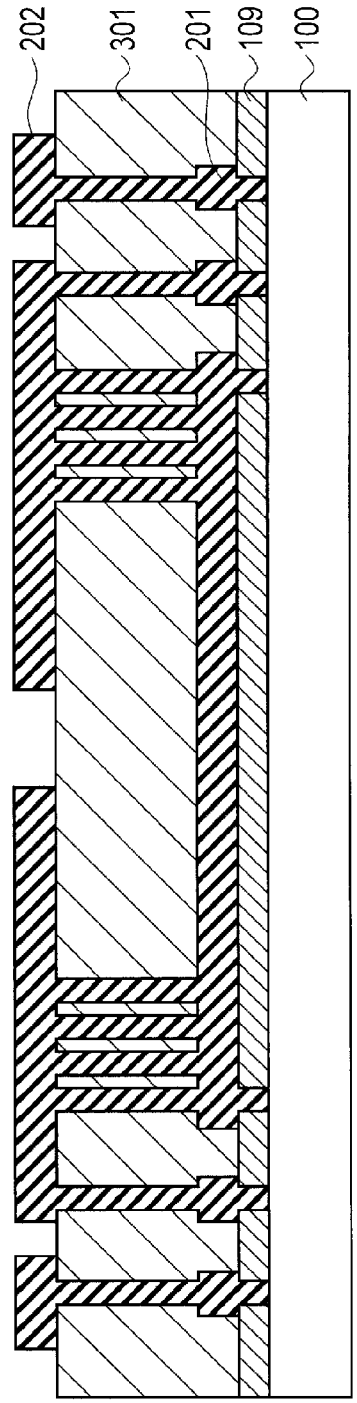
FIG. 44 is a sectional view for describing the manufacturing method, subsequent to FIG. 43, of the sensor according to the fifth embodiment.
Figure 45:
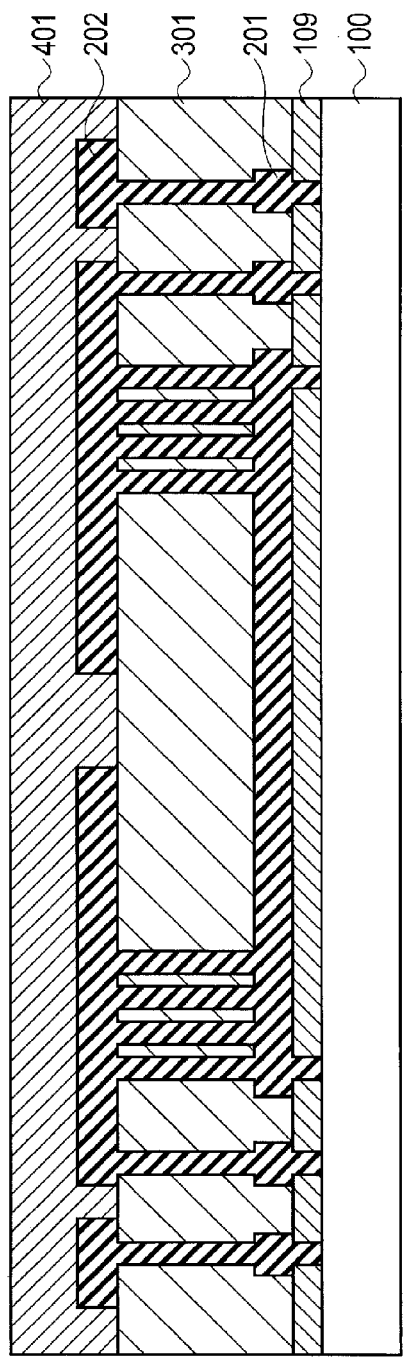
FIG. 45 is a sectional view for describing the manufacturing method, subsequent to FIG. 44, of the sensor according to the fifth embodiment.
Figure 46:
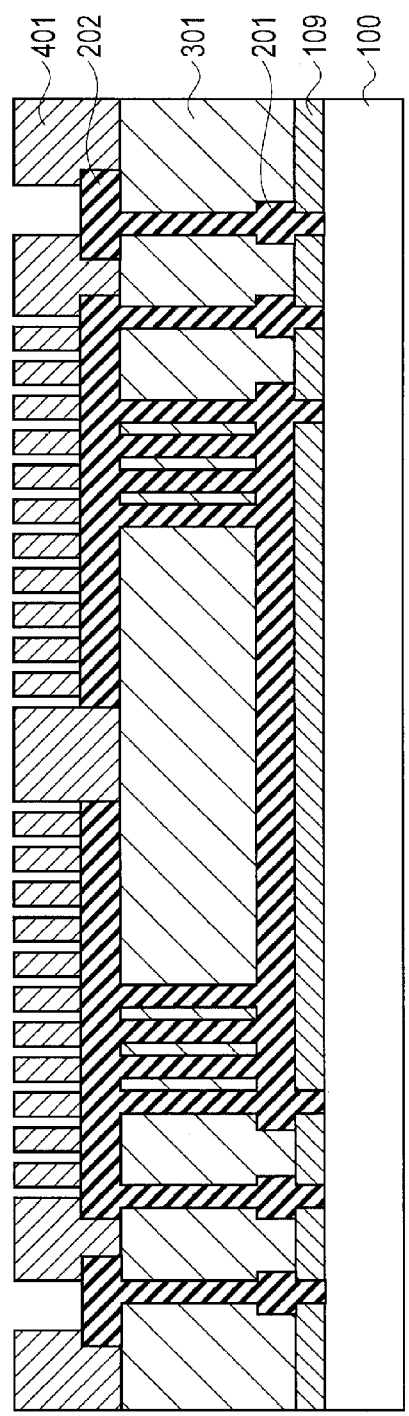
FIG. 46 is a sectional view for describing the manufacturing method, subsequent to FIG. 45, of the sensor according to the fifth embodiment.
Figure 47:
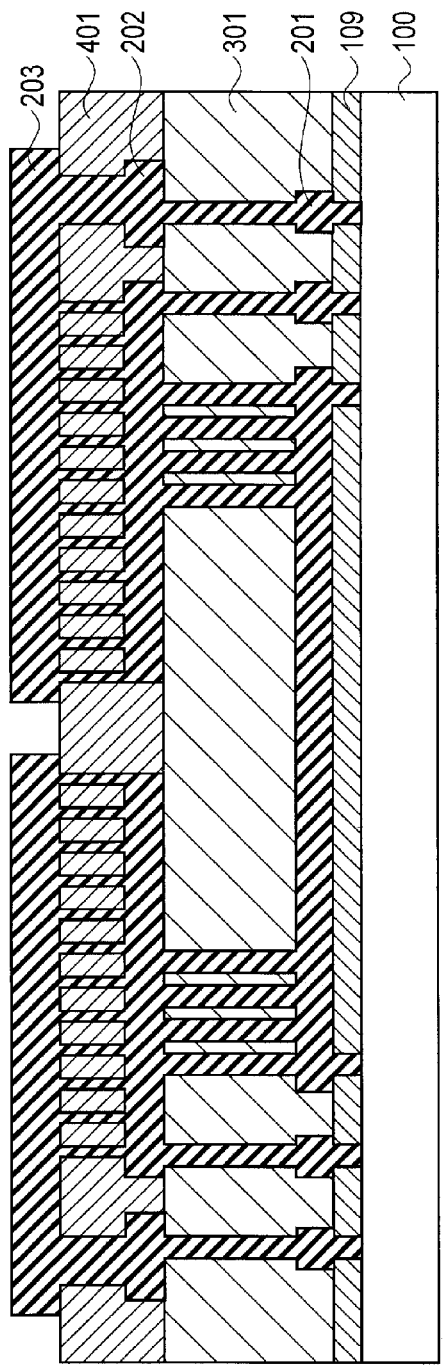
FIG. 47 is a sectional view for describing the manufacturing method, subsequent to FIG. 46, of the sensor according to the fifth embodiment.
Figure 48:
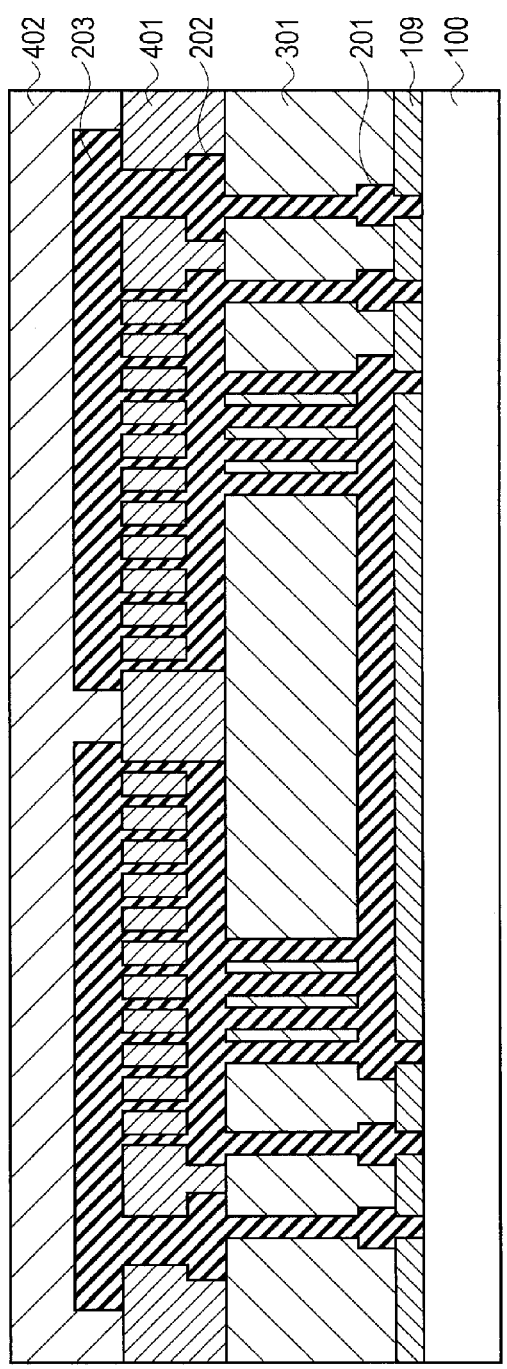
FIG. 48 is a sectional view for describing the manufacturing method, subsequent to FIG. 47, of the sensor according to the fifth embodiment.
Figure 49:
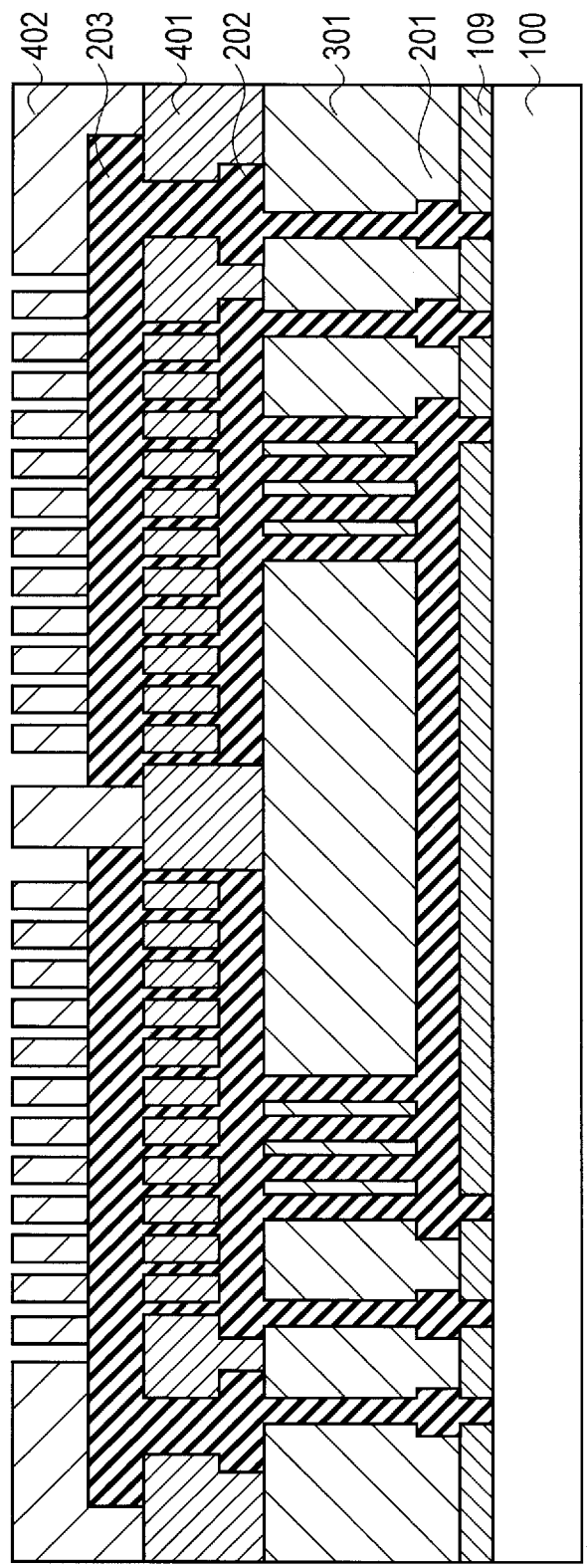
FIG. 49 is a sectional view for describing the manufacturing method, subsequent to FIG. 48, of the sensor according to the fifth embodiment.

The anchor portion 23, the movable membrane 60 and the connecting portion 60a which are constituted by the SiGe layer 402 and are shown in FIG. 43 are formed by patterning the SiGe layer 402 using photolithography process and etching process.

After that, the sacrificial films 201 to 203 are removed by HF gas, and the sensor, shown in FIG. 39, in which the insulating films 501 and 502 are formed on the SiGe layer 402 is obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sensor comprising:
   a substrate comprising a surface;
   a first fixed electrode arranged on the surface of the substrate;
   a movable electrode arranged above the first fixed electrode and being movable in a direction not parallel to the surface of the substrate;
   a second fixed electrode arranged above the movable electrode; and
   a detector which detects a difference between a first capacitance between the first fixed electrode and the movable electrode and a second capacitance between the movable electrode and the second fixed electrode;
   wherein the first fixed electrode, the movable electrode and the second fixed electrode are provided along a direction perpendicular to the surface of the substrate.

2. The sensor according to claim 1, wherein the second fixed electrode contains a through hole.

3. The sensor according to claim 2, further containing a first film provided on the second fixed electrode.

4. The sensor according to claim 3, wherein the first film faces the through hole of the second fixed electrode.

5. The sensor according to claim 3, further comprising a layer arranged above the second fixed electrode and containing a through hole, wherein the first film is provided on the layer, and the first film and the layer are provided along the direction perpendicular to the surface of the substrate.

6. The sensor according to claim 5, wherein the first film faces the through hole of the layer.

7. The sensor according to claim 2, further comprising a second film provided on the first film, wherein the second film has lower gas permeability than the first film.

8. The sensor according to claim 7, wherein the second film includes a silicon nitride film.

9. The sensor according to claim 1, wherein a cavity is present between the first fixed electrode and the substrate.

10. The sensor according to claim 9, wherein the first fixed electrode contains a through hole connecting to the cavity.

11. The sensor according to claim 1, wherein the first fixed electrode, the movable electrode and the second fixed electrode are comb-shaped.

12. The sensor according to claim 1, wherein the movable electrode is movable in an upper or a lower direction in accordance with change of an inertial force in the direction perpendicular to the surface of the substrate.

13. The sensor according to claim 12, further comprising an additional electrode movable in accordance with the change of the inertial force in a direction parallel to the surface of the substrate.

14. The sensor according to claim 12, further comprising a first additional electrode movable in accordance with the change of the inertial force in a first direction parallel to the surface of the substrate, and a second additional electrode movable in accordance with the change of the inertial force in a second direction parallel to the surface of the substrate and orthogonal to the first direction.

15. The sensor according to claim 13, wherein the additional electrode and the movable electrode are arranged in a same layer.

16. The sensor according to claim 1, further comprising a cap layer connected to an upper surface of the movable electrode, the cap layer and the substrate constituting a cavity in which the first fixed electrode, the movable electrode and the second fixed electrode are contained.

17. The sensor according to claim 16, wherein the cap layer is deformed in accordance with change in pressure of outside air, and the movable electrode is movable in an upper or a lower direction in accordance with the deformation of the cap layer.

18. The sensor according to claim 1, wherein the movable electrode is movable in the direction perpendicular to the surface of the substrate, and the first and second fixed electrodes are arrange to face the movable electrode.

\* \* \* \* \*